(12) United States Patent
Take et al.

(10) Patent No.: US 11,153,691 B2
(45) Date of Patent: *Oct. 19, 2021

(54) THIN-FILM FILTER, THIN-FILM FILTER SUBSTRATE, METHOD OF MANUFACTURING THE THIN-FILM FILTER, METHOD OF MANUFACTURING THE THIN-FILM FILTER SUBSTRATE, MEMS MICROPHONE AND METHOD OF MANUFACTURING THE MEMS MICROPHONE

(71) Applicant: SAE Magnetics (H.K.) Ltd., Hong Kong (HK)

(72) Inventors: Hiroshi Take, Hong Kong (HK); Makoto Yoshida, Hong Kong (HK); Anthony Reymund Melad Binarao, Hong Kong (HK); Cheng Bu Heng, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 154 days.

This patent is subject to a terminal disclaimer.

(21) Appl. No.: 16/712,976

(22) Filed: Dec. 12, 2019

(65) Prior Publication Data

US 2020/0296518 A1    Sep. 17, 2020

(30) Foreign Application Priority Data

Mar. 15, 2019   (JP) ............................. JP2019-048174

(51) Int. Cl.
*H04R 19/00*    (2006.01)
*H04R 19/04*    (2006.01)
(Continued)

(52) U.S. Cl.
CPC .......... *H04R 19/04* (2013.01); *B01D 39/1692* (2013.01); *B81B 7/0058* (2013.01); *B81C 1/00333* (2013.01); *H04R 1/086* (2013.01); *H04R 31/00* (2013.01); *B01D 2239/10* (2013.01); *B81B 2201/0257* (2013.01); *B81C 2201/0194* (2013.01); *H04R 2201/003* (2013.01)

(58) Field of Classification Search
CPC ........ H04R 19/04; H04R 31/00; H04R 1/086; H04R 19/005; H04R 25/654; B81B 7/0058; B81C 1/00333; B01D 39/1692
See application file for complete search history.

(56) References Cited

U.S. PATENT DOCUMENTS

| 9,565,488 | B2 | 2/2017 | Friza et al. |
| 10,491,991 | B2* | 11/2019 | Yoo ..................... H04R 19/005 |
| 2012/0244314 | A1* | 9/2012 | Scheibner .......... B01D 39/1623 428/137 |

FOREIGN PATENT DOCUMENTS

| JP | 2012-039272 A | 2/2012 |
| JP | 2015-199069 A | 11/2015 |
| JP | 2017-221887 A | 12/2017 |

* cited by examiner

*Primary Examiner* — Matthew A Eason

(57) ABSTRACT

A thin-film filter includes thin-film part having a film surface and a rear film surface arranged a rear side of the film surface, a plurality of through holes being formed to penetrate the thin-film part from the film surface to the rear film surface, and stripes-formed inner wall surfaces. The stripes-formed inner wall surfaces include stripe-like parts formed along with an intersecting direction intersecting the film surface. The stripes-formed inner wall surfaces are formed inside the respective through holes.

17 Claims, 30 Drawing Sheets

(51) Int. Cl.
*B81B 7/00* (2006.01)
*B81C 1/00* (2006.01)
*H04R 31/00* (2006.01)
*B01D 39/16* (2006.01)
*H04R 1/08* (2006.01)

(a)

(b)

THIN-FILM FILTER, THIN-FILM FILTER SUBSTRATE, METHOD OF MANUFACTURING THE THIN-FILM FILTER, METHOD OF MANUFACTURING THE THIN-FILM FILTER SUBSTRATE, MEMS MICROPHONE AND METHOD OF MANUFACTURING THE MEMS MICROPHONE

CROSS REFERENCE TO RELATED APPLICATIONS

The present application claims the benefit of Japanese Patent Application No. 2019-048174 filed on Mar. 15, 2019, the contents of which are incorporated herein by reference in their entirety.

BACKGROUND

Field of the Invention

The present invention relates to a thin-film filter, being used for prevention of entry of particles, water or the like, a thin-film filter substrate having the thin-film filter, a method of manufacturing the thin-film filter, a method of manufacturing the thin-film filter substrate, a MEMS microphone having the thin-film filter and a Method of manufacturing the MEMS microphone.

Related Background Art

A filter is conventionally used for prevention of entry, to the inside, of micro things such as particles, cells or the like and water. Concerning such a filter, for example, a polymer film, which micro perforations are formed, is disclosed in patent document 1 (JP2015-199069). In case of the polymer film, diameters of the respective perforations, appeared in the film surface side, are different from diameters, appeared in the rear surface side.

Further, a processed film, which a plurality of through holes are formed systematically with high density, is disclosed in patent document 2 (JP2017-221887).

SUMMARY OF THE INVENTION

By the way, in case of the above-described conventional technologies, the filters are manufactured with resin films. In this case, punching processing is performed to the resin films, the punched resin films, manufactured by the punching processing, are used for the filter.

However, for example, when the punching processing is performed with laser, a part, which is etched by laser irradiation, becomes debris (pieces), the debris are likely to adhere the inside of the holes of the punched resin films. Then, a part of the hole is blocked up by the debris, thereby filtering function of the filter is lowered. Further, the size of each hole becomes uneven caused by adhesion of the debris. Therefore, the punched resin films, which the punching processing is performed with laser, are not able to be used as a filter.

On the other hand, the punching processing is sometimes performed by wet etching. In this case, when holes are formed by wet etching, in the inside of each hole, the inside wall surface is formed to be a smooth surface, not having concave part and convex part.

When the punched resin films are used as the filter, an air stream, along with the direction which is different from the direction of the hole, flows inside the holes. Then, load is applied to the inside surface of the hole. Because the peripheral parts of the holes are weaker than the other parts, in the punched resin films, the peripheral parts of the holes are easier to be damaged. Therefore, the punched resin films, which the punching processing is performed by wet etching, have low durability.

Hence the present invention is made to solve the above problem, and it is an object to provide the thin-film filter having the structure, which hole size is constant, and air stream, passing through each hole, flow along the constant direction, a thin-film filter substrate having the thin-film filter, a method of manufacturing the thin-film filter, a method of manufacturing the thin-film filter substrate, a MEMS microphone having the thin-film filter and a Method of manufacturing the MEMS microphone.

To solve the above problem, the present invention is a thin-film filter including: a thin-film part having a film surface and a rear film surface arranged a rear side of the film surface, a plurality of through holes being formed to penetrate the thin-film part from the film surface to the rear film surface, and stripes-formed inner wall surfaces having stripe-like parts formed along with an intersecting direction intersecting the film surface, the stripes-formed inner wall surfaces are formed inside the respective through holes.

Further, in case of the above-described thin-film filter, it is preferable that the stripe-like parts are arranged in almost the whole of the inner surface of the respective through holes.

Further, it is preferable that the stripe-like parts are formed in the length longer than 80% of a film thickness being a thickness of the thin-film part.

Furthermore, it is preferable that the through holes are formed in a circular shape in a plan view, the thin-film filter includes a first through hole-group and a second through hole-group respectively having the through holes, the first through hole-group has a first through hole, arranged in a position which the interval to a peripheral end part of the thin-film part is set a first interval, and the through holes are arranged at a constant interval in a straight line, the second through hole-group has a second through hole, arranged in a position which the interval to the peripheral end part is set a second interval different from the first interval, and the through holes are arranged at a constant interval in a straight line, in the thin-film filter, a first line formed by the first through hole-group, and a second line formed by the second through hole-group, are arranged alternately.

Further, it is possible that in the thin-film filter, the adjacent through holes, including both the through hole included in the first through hole-group and the through hole included in the second through hole-group, are arranged to form a regular triangle which the centers of the adjacent through holes are vertexes.

Further, the present invention provides a thin-film filter substrate including: a base substrate having a base surface; and a thin-film filter being formed on the base surface of the base substrate, the thin-film filter includes a thin-film part having a film surface and a rear film surface arranged a rear side of the film surface, a plurality of through holes being formed to penetrate the thin-film part from the film surface to the rear film surface, and stripes-formed inner wall surfaces having stripe-like parts formed along with an intersecting direction intersecting the film surface, the stripes-formed inner wall surfaces are formed inside the respective through holes.

In case of the above-described thin-film filter substrate, it is possible that peeling-off adhesive layer capable of being peeled off, the peeling-off adhesive layer is formed on the base surface, the thin-film filter is formed on the peeling-off adhesive layer.

Further, it is possible that the base substrate includes a plurality of separative regions formed by a regular arrangement, the thin-film filter includes a plurality of filter regions formed in accordance with the respective separative regions, the through holes and the stripes-formed inner wall surfaces are formed in the respective filter regions.

Further, the present invention provides a method of manufacturing the thin-film filter, including: a peeling-off adhesive layer forming step of forming a peeling-off adhesive layer, capable of being peeled off, on a base substrate; a thin-film filter forming step of forming a thin-film filter on the peeling-off adhesive layer; and a thin-film filter peeling-off step of peeling off the thin-film filter from the peeling-off adhesive layer of a thin-film filter substrate, which the peeling-off adhesive layer and the thin-film filter are formed by performing the peeling-off adhesive layer forming step and the thin-film filter forming step, the thin-film filter forming step includes a resin layer forming step of forming a resin layer on the peeling-off adhesive layer of the base substrate, and a through hole forming step of forming through holes which penetrate from a surface to the rear surface of the resin layer, so that stripes-formed inner wall surfaces, having stripe-like parts formed along with an intersecting direction intersecting the surface of the resin layer, are formed.

In case of the above-described method of manufacturing the thin-film filter, it is possible that the thin-film filter forming step further includes a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts using the resist pattern as a mask, the through hole forming step is performed by performing reactive ion etching using the metal pattern as a mask to form the stripes-formed inner wall surfaces.

Then, the present invention provides a method of manufacturing the thin-film filter substrate, which a thin-film filter is formed on a base substrate including: a peeling-off adhesive layer forming step of forming a peeling-off adhesive layer, capable of being peeled off, on the base substrate; and a thin-film filter forming step of forming a thin-film filter on the peeling-off adhesive layer, the thin-film filter forming step includes a resin layer forming step of forming a resin layer on the peeling-off adhesive layer of the base substrate, and a through hole forming step of forming through holes which penetrate from a surface to the rear surface of the resin layer, so that stripes-formed inner wall surfaces, having stripe-like parts formed along with an intersecting direction intersecting the surface of the resin layer, are formed.

Further, in case of the above-described method of manufacturing the thin-film filter substrate, it is possible that the thin-film filter forming step further includes a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts using the resist pattern as a mask, the through hole forming step is performed by performing reactive ion etching using the metal pattern as a mask to form the stripes-formed inner wall surfaces.

Then, the present invention provides a MEMS microphone, including: a MEMS chip; a package substrate which the MEMS chip is adhered; and a thin-film filter formed on the package substrate or the MEMS chip, the thin-film filter includes a thin-film part having a film surface and a rear film surface arranged a rear side of the film surface, a plurality of through holes being formed to penetrate the thin-film part from the film surface to the rear film surface, and stripes-formed inner wall surfaces having stripe-like parts formed along with an intersecting direction intersecting the film surface, the stripes-formed inner wall surfaces are formed inside the respective through holes.

Then, the present invention provides a method of manufacturing the MEMS microphone, using a MEMS chip and a package substrate which the MEMS chip is adhered including: a photosensitive-adhesive layer forming step of forming a photosensitive-adhesive layer, made of photosensitive-adhesive, on a surface of a package-panel which a plurality of package-regions for manufacturing the package substrate are formed; a thin-film filter peeling-off step of peeling-off a thin-film filter from a peeling-off adhesive layer of a thin-film filter substrate, which is manufactured by performing a peeling-off adhesive layer forming step of forming the peeling-off adhesive layer, capable of being peeled off, on a base substrate and a thin-film filter forming step of forming the thin-film filter on the peeling-off adhesive layer; and a thin-film filter transcribing step for transcribing the thin-film filter, peeled off by the thin-film filter peeling-off step, to the package-panel, the thin-film filter forming step includes a resin layer forming step of forming a resin layer on the peeling-off adhesive layer of the base substrate, and a through hole forming step of forming through holes which penetrate from a surface to the rear surface of the resin layer, so that stripes-formed inner wall surfaces, having stripe-like parts formed along with an intersecting direction intersecting the surface of the resin layer, are formed.

In case of the above-described method of manufacturing the MEMS microphone, it is possible that the thin-film filter forming step further includes a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts using the resist pattern as a mask, the through hole forming step is performed by performing reactive ion etching using the metal pattern as a mask to form the stripes-formed inner wall surfaces.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

Embodiment of the Thin-Film Filter and the Thin-Film Filter Substrate

Figure 1:
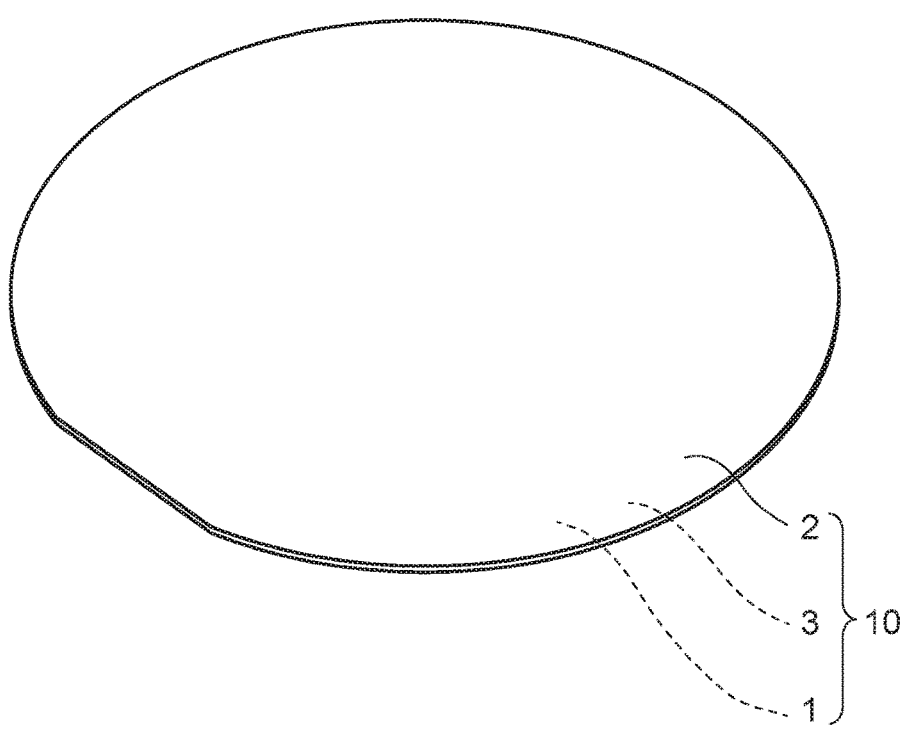
FIG. 1 is a perspective view showing a thin-film filter substrate according to the embodiment of the present invention.
Figure 2:
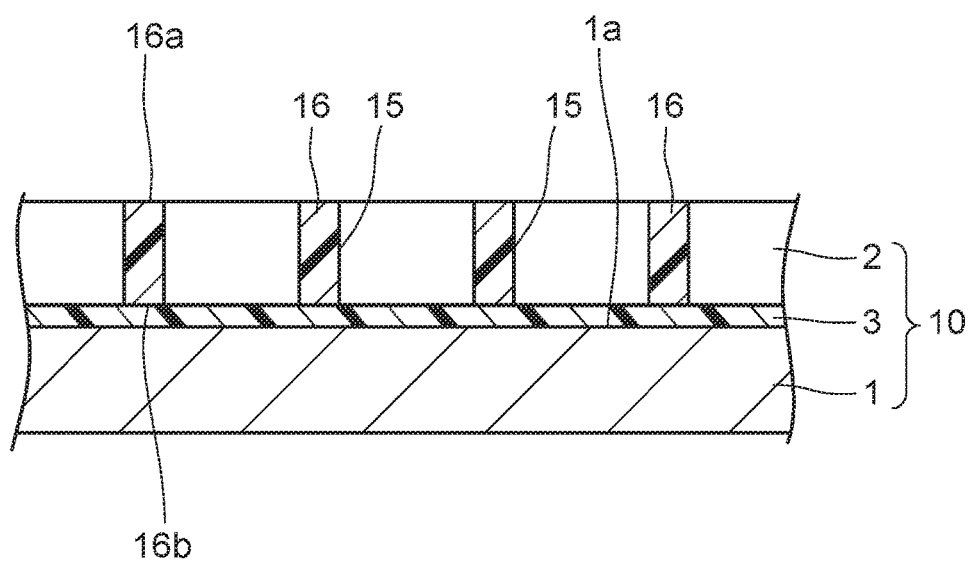
FIG. 2 is a sectional view of the thin-film filter substrate.
Figure 3:
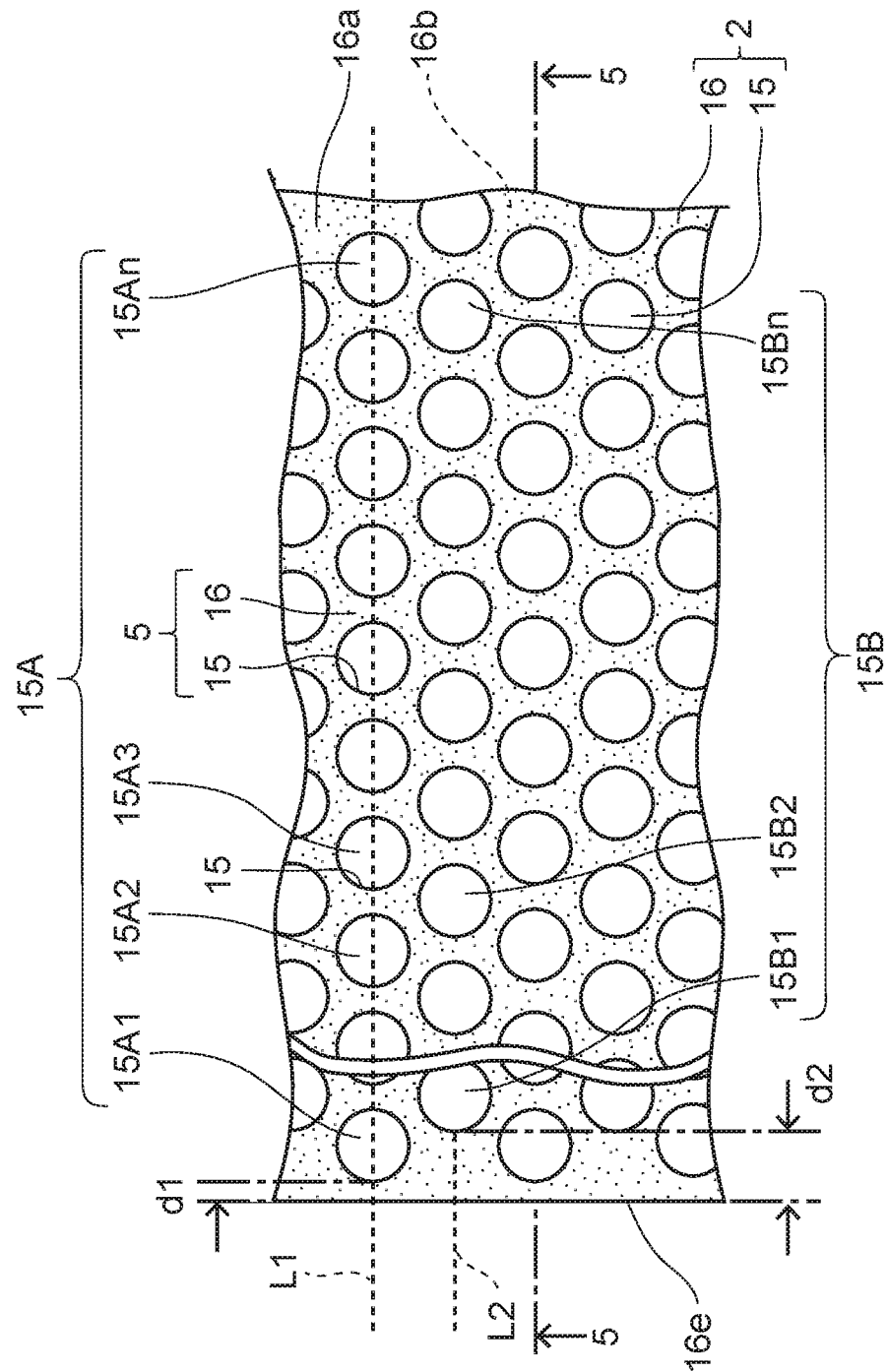
FIG. 3 is a plan view, with enlargement, of the principal part of a thin-film filter.
Figure 4:
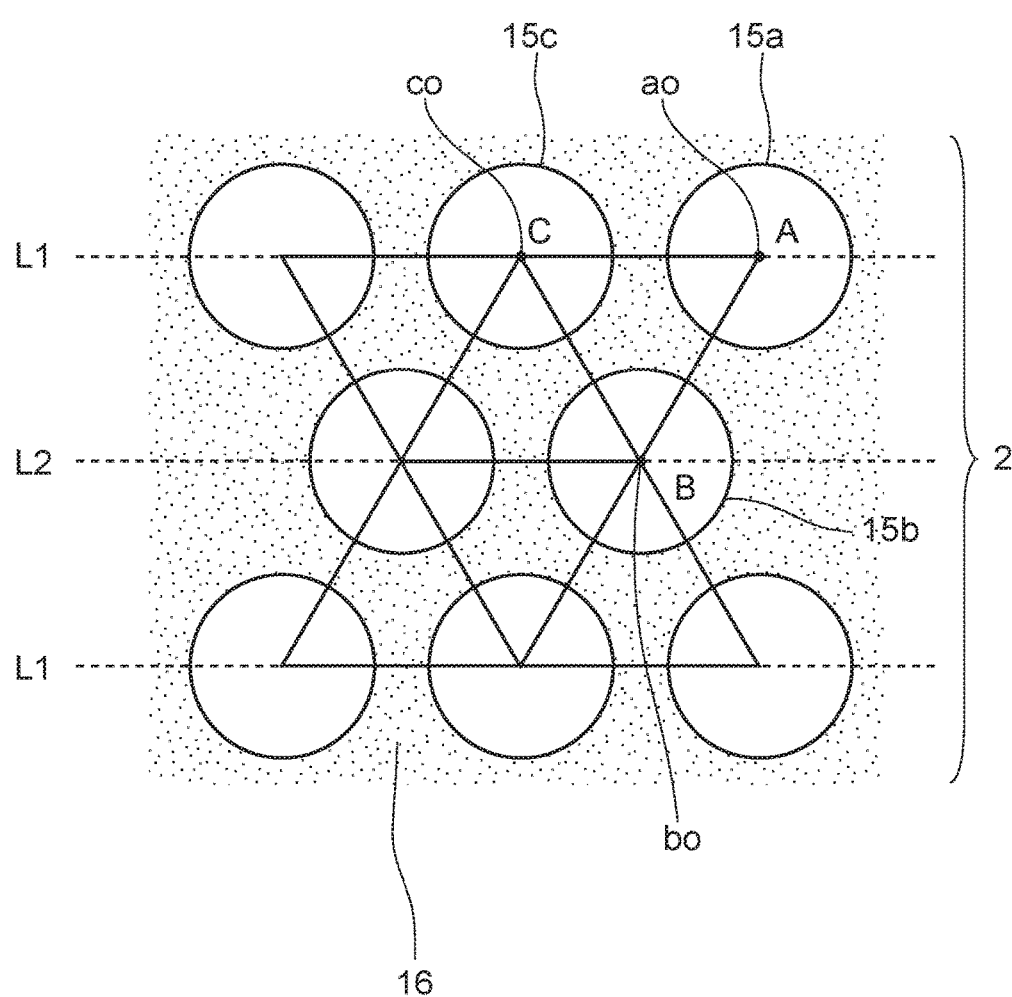
FIG. 4 is a plan view, with enlargement, of the part, including a plurality of through holes, of the thin-film filter.
Figure 5:
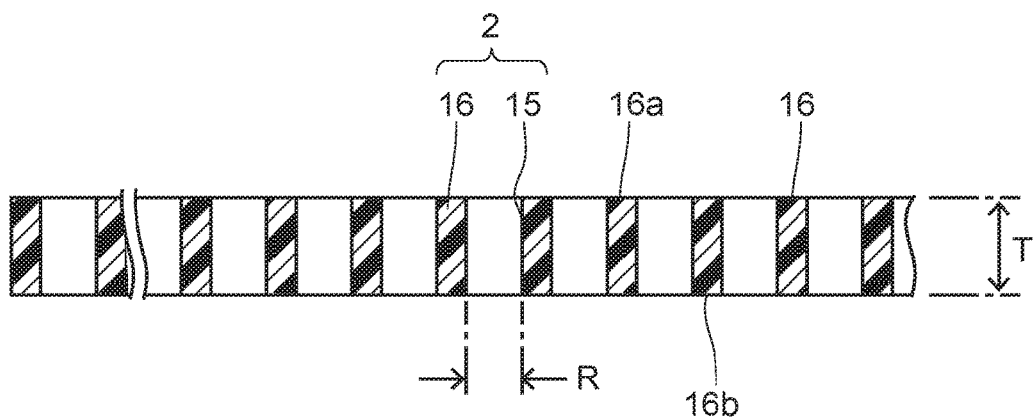
FIG. 5 is a sectional view of a part corresponding to the line 5-5 in FIG. 3.
Figure 6:
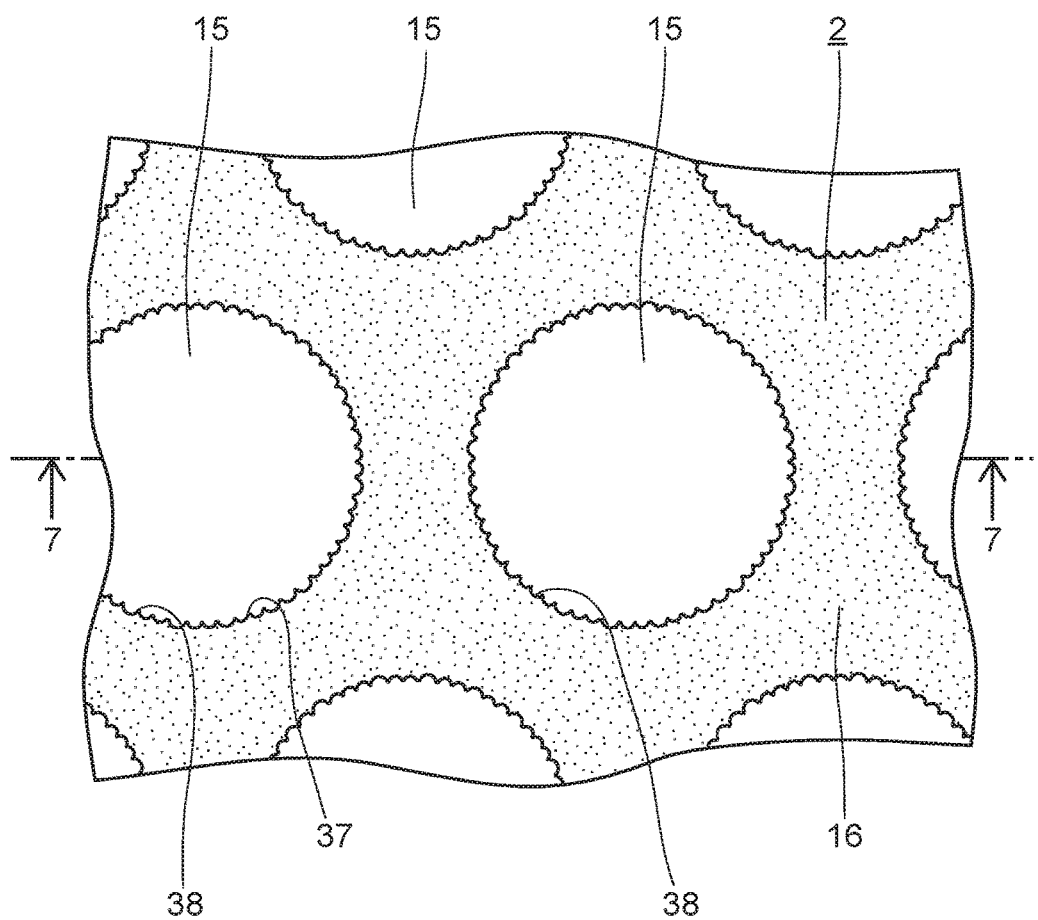
FIG. 6 is a plan view, with more enlargement, showing the principal part of the thin-film filter according to the embodiment of the present invention.
Figure 7:
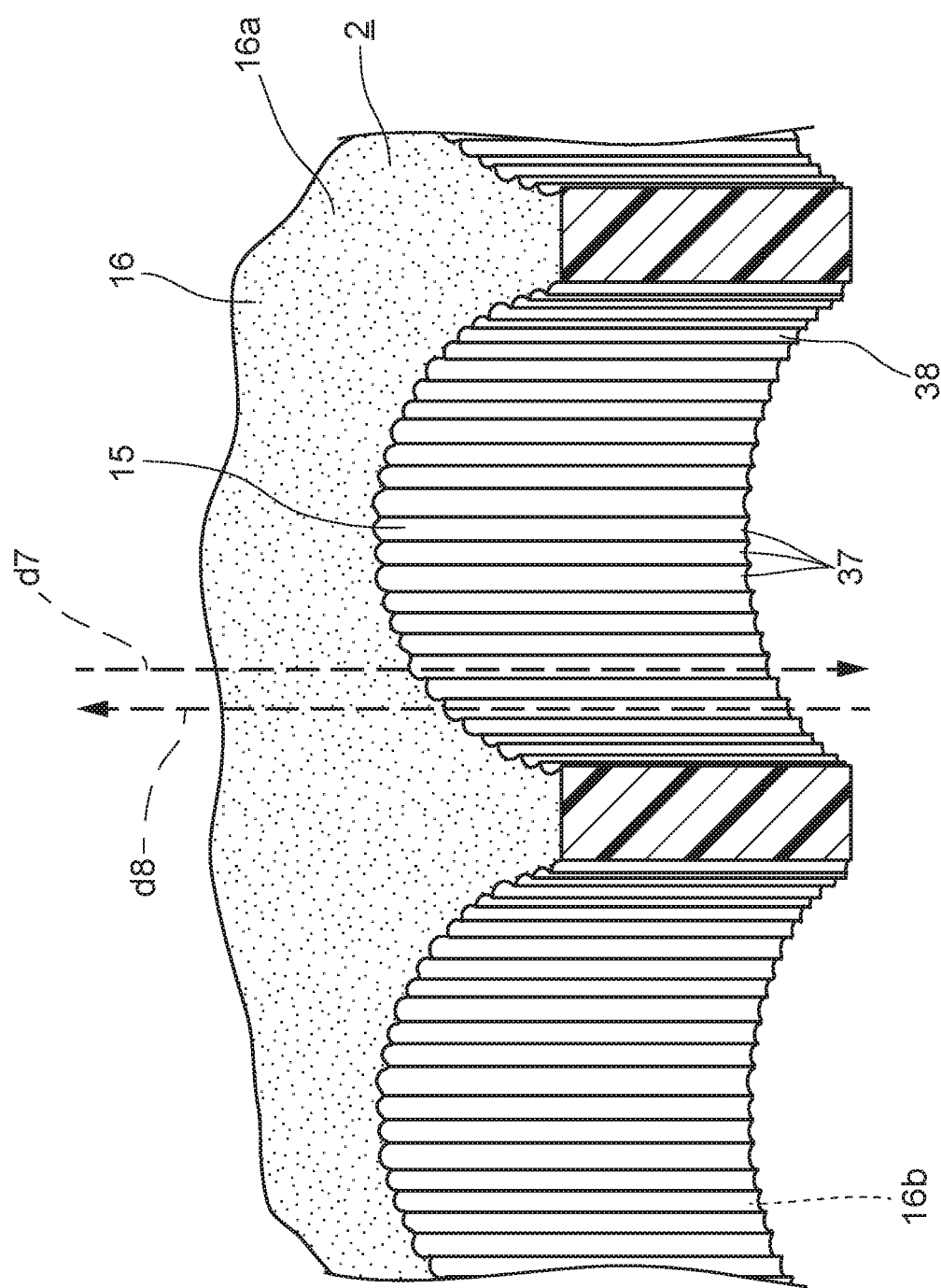
FIG. 7 is a perspective view showing a sectional surface corresponding to the line 7-7 in FIG. 6.
Figure 8:
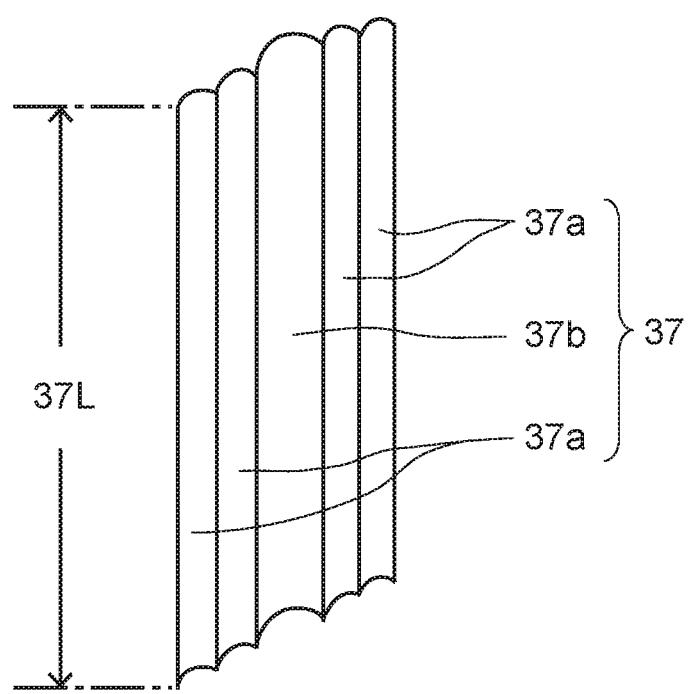
FIG. 8 is a perspective view showing a principal part of a stripe-like part.

To begin with, the structure of a thin-film filter 2, a thin-film filter substrate 10, according to the embodiment of the present invention will be explained with mainly reference to FIG. 1 to FIG. 8. Here, FIG. 1 is a perspective view showing the thin-film filter substrate 10 according to the embodiment of the present invention. FIG. 2 is a sectional view of the thin-film filter substrate 10. FIG. 3 is a plan view, with enlargement, of the principal part of the thin-film filter 2. FIG. 4 is a plan view, with enlargement, of the part, including a plurality of through holes, of the thin-film filter 2. FIG. 5 is a sectional view of a part corresponding to the line 5-5 in FIG. 3. FIG. 6 is a plan view, with more enlargement, showing the principal part of the thin-film filter 2. FIG. 7 is a perspective view showing a sectional surface corresponding to the line 7-7 in FIG. 6. FIG. 8 is a perspective view showing a principal part of a stripe-like part 37.

The thin-film filter substrate 10 has a silicon wafer 1, as a base substrate (a substrate, made of glass, quartz or the like, is able to be used), the thin-film filter 2 and a peeling-off adhesive layer 3.

The silicon wafer 1 has a base surface 1a, being a surface of one side. As illustrated in FIG. 2, the peeling-off adhesive layer 3 is formed on the base surface 1a, the thin-film filter 2 is formed on the peeling-off adhesive layer 3.

The thin-film filter 2 is a filter used for prevention of entry of particles and water. As illustrated in FIG. 3, the thin-film filter 2 has a thin-film part 16, which is formed with polyamide or polyimide film. Further, a plurality of through holes 15 are formed in the thin-film part 16, and an stripes-formed inner wall surface 38, as illustrated in FIGS. 6, 7, are formed inside the respective through holes 15.

The thin-film part 16 has a film surface 16a, being a surface of one side, and a rear film surface 16b, being arranged rear side of the film surface 16a, as illustrated in FIG. 2. A plurality of through holes 15 are formed in the thin-film part 16 by a regular uniformly arrangement. In FIG. 3, FIG. 4, dots are shown in the film surface 16a.

The respective through holes 15 are hole parts which penetrate from the film surface 16a to the rear film surface 16b, as illustrated in FIG. 2. The respective through holes 15 are formed in the constant size (diameter), from the film surface 16a to the rear film surface 16b. The through holes 15 are also formed so that the intervals of the adjacent through holes 15 are constant sizes.

Further, the respective through holes 15 are formed in a circular shape in a plan view. The diameters (shown as "R" in FIG. 5) is approximately about 2 µm to 6 µm. Further, the thickness (shown as "T" in FIG. 5, corresponding to a film thickness being a thickness of the thin-film part 16) of the thin-film filter 2 is approximately about 1 µm to 6 µm.

Then, as illustrated in FIG. 3 in detail, the thin-film filter 2 has a first through hole-group 15A and a second through hole-group 15B. A plurality of through holes 15, including a first through hole 15A1, through holes 15A2, 15A3 . . . through hole 15An, are included in the first through hole-group 15A. The first through hole 15A1 is arranged in a position which the interval to a peripheral end part 16e of the thin-film part 16 is set a first interval d1, and it is arranged the nearest position to the peripheral end part 16e among the through holes 15 included in the first through hole-group 15A. The first through hole 15A1, through holes 15A2, 15A3 . . . 15An are arranged at a constant interval in a straight line along with a direction intersecting vertically to the peripheral end part 16e to form a first line L1.

A plurality of through holes 15, including a second through hole 15B1, the through hole 15B2, the through hole 15Bn, are included in the second through hole-group 15B. The second through hole 15B1 is arranged in a position which the interval to the peripheral end part 16e is set a second interval d2 larger than the first interval d1, and it is arranged the nearest position to the peripheral end part 16e among through holes 15 included in the second through hole-group 15B. The second through hole 15B1, through holes 15B2 . . . 15Bn are arranged at a constant interval in the direction intersecting vertically to the peripheral end part 16e to form a second line L2.

Then, in the thin-film filter 2, the first line L1 and the second line L2 are arranged alternately.

Further, the thin-film filter 2 is formed so that the center of the through hole 15 (for example, the through hole 15B2, in FIG. 3), included in the second through hole-group 15B, is arranged between the centers of the adjacent through holes 15 (for example, the through hole 15A2, the through hole 15A3, in FIG. 3), included in the first through hole-group 15A.

The through holes 15 become a path of the air though, because the part between the adjacent through holes 15 is the thin-film part 16 (the part with dots in FIGS. 3, 4), the part does not become the path of the air.

Then, in case of the thin-film filter 2, as illustrated in FIG. 4, the three adjacent through holes 15a, 15b, 15c are considered as the representative through holes. The centers of the through holes 15a, 15b, 15c are a0, b0, c0 though, the triangle (the triangle ABC, in FIG. 4) which these centers are vertexes, is a regular triangle, according to the regularity of the arrangement of the through holes 15. Further, the thin-film filter 2 is formed so that the arrangement density of the through holes 15, in the thin-film part 16, may rise as much as possible. In case of the thin-film filter 2, the intervals between adjacent through holes 15 are narrowed so that another through hole 15 is not able to be formed in the space between the adjacent three through holes 15 (for example, another through hole 15 is not able to be formed in the space between the through holes 15a, 15b, 15c, the structure is also referred to a high-density structure).

Then, in the thin-film filter 2, as illustrated in FIG. 6, FIG. 7, the stripes-formed inner wall surfaces 38 are formed inside the respective through holes 15. The stripes-formed inner wall surface 38 has a plurality of stripe-like parts 37. A plurality of stripe-like parts 37 are arranged in almost the whole of the inner surface of the respective through holes 15. The stripes-formed inner wall surfaces 38 are formed in almost the whole of the inner surface of the respective through holes 15. The stripe-like parts 37 are formed closely so that a smooth part does not remain in the inner surface of the respective through holes 15.

The stripe-like parts 37 are formed along with an intersecting direction, which intersects the film surface 16a, namely, a direction which unites the film surface 16a and the rear film surface 16b in the shortest distance (direction shown as "d7", "d8" in FIG. 7).

The respective stripe-like parts 37 are convex parts or concave parts, formed on the inner surface of the through holes 15, approximately in the straight line along with the intersecting direction. All of the respective stripe-like parts 37 are able to be formed as the convex parts, and they are able to be formed as the concave parts. The convex parts and the concave parts are able to be included mixedly as the stripe-like part 37.

The stripe-like parts 37 are drawn in FIG. 8, as the concave parts along with the intersecting direction. The stripe-like parts 37, drawn in FIG. 8, have first stripe-like parts 37a and second stripe-like parts 37b, having wider width than the first stripe-like parts 37a. The respective stripe-like parts 37 are formed in the length longer than 80% of the film thickness T. The length 37L of the respective stripe-like parts 37 have the size larger than the 80% of the film thickness T. It is possible that the length of the respective stripe-like parts 37 are common, like the stripe-like parts 37, shown in FIG. 8. It is possible that the length of the respective stripe-like parts 37 are different (not shown in the drawings).

The peeling-off adhesive layer 3 is formed with the adhesive capable of peeling off. For example, the peeling-off adhesive layer 3 is formed with a thermal-foaming tape made of thermal-foaming resin, which peels off by heating, or a UV tape.

(Method of Manufacturing the Thin-Film Filter and the Thin-Film Filter Substrate)

Figure 9:
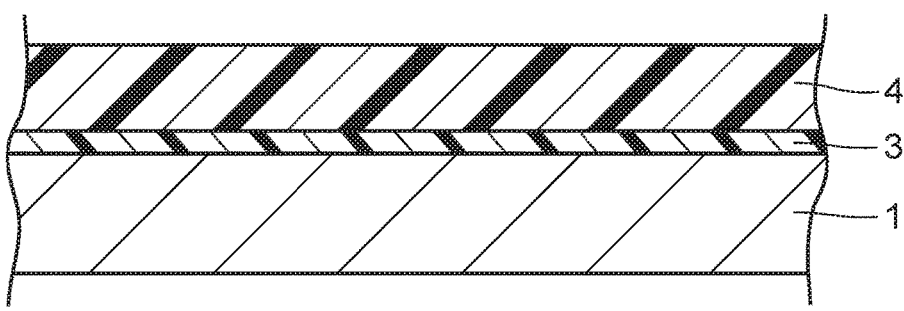
FIG. 9 is a sectional view showing a principal part of a manufacturing step of the thin-film filter and the thin-film filter substrate according to the embodiment of the present invention.
Figure 10:
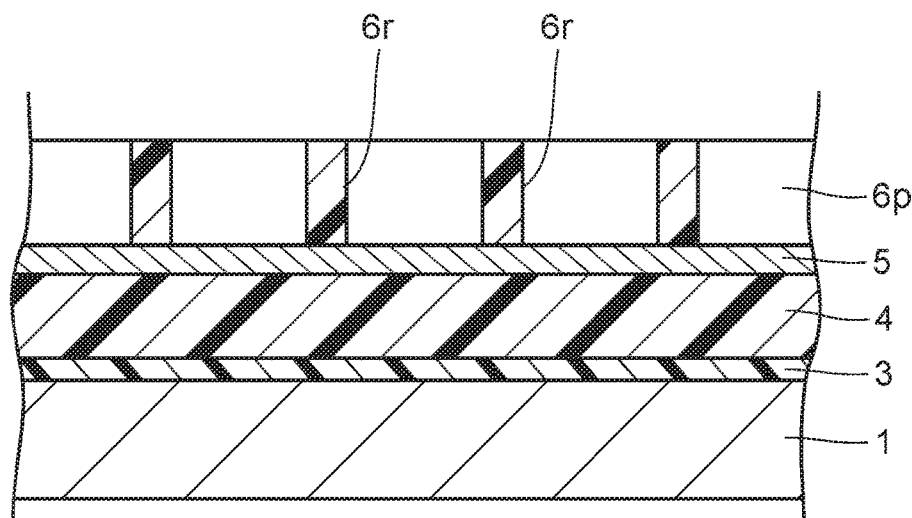
FIG. 10 is a sectional view of a principal part showing the manufacturing step subsequent that in FIG. 9.
Figure 11:
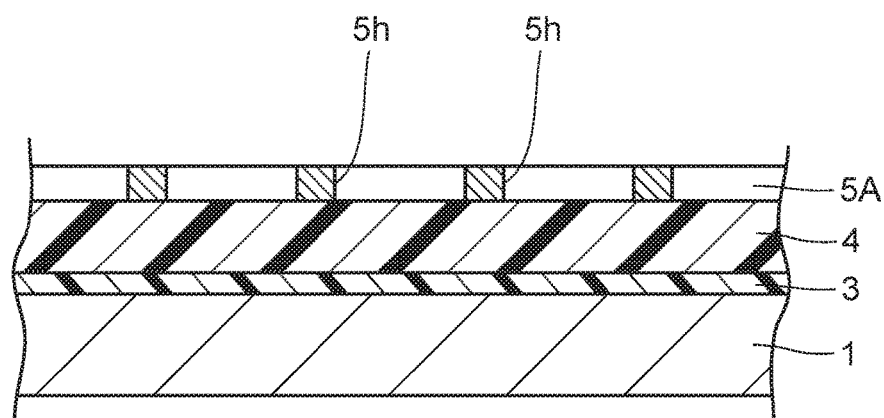
FIG. 11(a) is a sectional view of a principal part showing the manufacturing step subsequent that in FIG. 10.
FIG. 11(b) is a sectional view of a principal part showing the manufacturing step subsequent that in FIG. 11(a)
Figure 11:
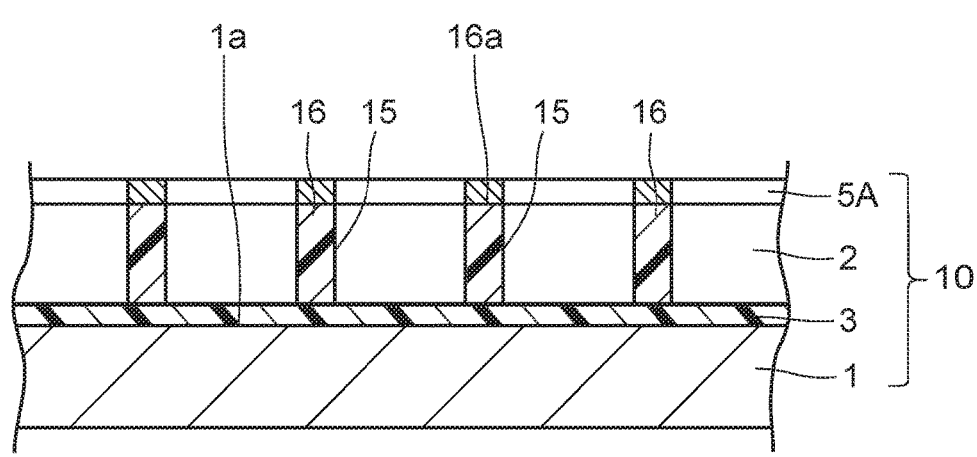

Subsequently, the method of manufacturing the thin-film filter 2 and the thin-film filter substrate 10, having the above-described structure, will be explained with reference to FIG. 9 to FIG. 10. Here, FIGS. 9-11 are sectional views showing a principal part of the manufacturing step of the thin-film filter 2 and the thin-film filter substrate 10.

The thin-film filter substrate 10 is manufactured by performing the following thin-film filter substrate manufacturing step. The thin-film filter 2 is manufactured by performing a thin-film filter peeling-off step to the manufactured thin-film filter substrate 10.

(Thin-Film Filter Substrate Manufacturing Step)

Then, the thin-film filter substrate manufacturing step has a peeling-off adhesive layer forming step and a thin-film filter forming step.

In the peeling-off adhesive layer forming step, the peeling-off adhesive layer 3 is formed on the silicon wafer 1. In this case, for example, a thermal-foaming tape is applied on the base surface 1a of the silicon wafer 1, as the base substrate. Then, as illustrated in FIG. 9, the peeling-off adhesive layer 3 is formed. Further, the thermal-foaming resin, not-illustrated, is applied on the base surface 1a of the silicon wafer 1, thereby the peeling-off adhesive layer 3 is able to be formed.

Resin and foaming agent are included in thermal-foaming resin. Thermal-foaming resin generates gas by heating to be able to foam. When the thermal-foaming resin is applied to form the thermal-foaming resin layer, the thermal-foaming resin layer becomes a thermal peeling-off layer, peeling-off by heating, and the peeling-off adhesive layer 3 is formed with the thermal peeling-off layer. Further, the thermal-foaming resin sheet, which the thermal-foaming resin is processed into a sheet-like form, is applied to be able to form the thermal-foaming resin layer. In this case, the peeling-off adhesive layer 3 is formed with the thermal-foaming resin sheet. Further, it is possible that the peeling-off adhesive layer 3 is formed with polyimide-based adhesive, epoxy resin-based adhesive.

Next, the thin-film filter forming step is performed to form the thin-film filter 2 on the peeling-off adhesive layer 3. A resin layer forming step, a metal layer forming step, a resist pattern forming step, a metal pattern forming step and a through hole forming step are included in the thin-film filter forming step.

At first, the resin layer forming step is performed. In the resin layer forming step, as illustrated in FIG. 9, a resin layer 4 is formed, with polyamide or polyimide film, on the peeling-off adhesive layer 3.

Next, the metal layer forming step is performed. In the metal layer forming step, as illustrated in FIG. 10, a metal layer 5 is formed, with Titan (Ti), on the surface of the resin layer 4. The metal layer 5 is able to be formed, with SUS, Cr other than Titan (Ti).

Subsequently, the resist pattern forming step is performed. In the resist pattern forming step, photoresist is applied on the surface of the metal layer 5. After that, an exposure is performed with not-illustrated photomask, further a development is performed, thereby a resist pattern 6p, having a plurality of hole parts 6r, is formed.

Next, a metal pattern forming step is performed. In the metal pattern forming step, a milling with Ar, to the metal layer 5, is performed with the resist pattern 6p as a mask (reactive ion etching is able to be performed, wet etching is also able to be performed). After that, the resist pattern 6p is removed. Then, as illustrated in FIG. 11(*a*), unnecessary parts of the metal layer 5 are removed to form corresponding hole parts 5h, corresponding to the hole parts 6r of the resist pattern 6p, is formed on the metal layer 5. Thereby a metal pattern 5A is formed. The metal pattern 5A is formed by a pattern in accordance with the thin-film filter 2, being formed later.

Subsequently, the through hole forming step is performed. In the through hole forming step, reactive ion etching (RIE), to the resin layer 4, is performed, with the metal pattern 5A as a mask so that the stripes-formed inner wall surfaces 38 are formed. Then, as illustrated in FIG. 11(*b*), the parts, of the resin layer 4, which are not covered with the metal pattern 5A, are removed in accordance with the metal pattern 5A as unnecessary parts. In this case, the through holes 15 are formed on the parts which the unnecessary parts are removed. In this case, in case of reactive ion etching, etching proceeds by effect of both sputter operation by ion and chemical reaction. Therefore, in case of reactive ion etching, a perpendicular shape, not having under cut, is likely to be realized. Therefore, a plurality of stripe-like parts 37 are formed inside the respective through holes 15, thereby the stripes-formed inner wall surfaces 38 are formed. In this way, the thin-film filter 2, having the thin-film part 16, is able to be obtained from the resin layer 4, that reactive ion etching (RIE) is performed after.

After the through hole forming step is performed, as illustrated in FIG. 2, the metal pattern 5A is sometimes removed through, the metal pattern 5A is sometimes left on the surface of the thin-film part 16 (the film surface 16a), as the thin-film filter 2 illustrated in FIG. 11(*b*). As described above, the thin-film filter substrate 10 is manufactured.

Figure 27:
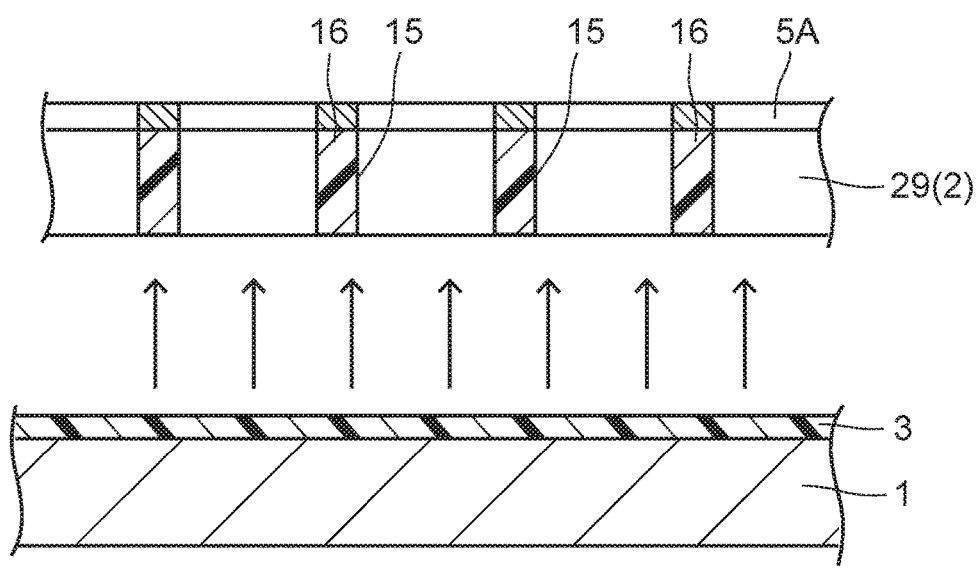
FIG. 27 is a sectional view showing a principal part of a thin-film filter peeling-off step.

Next, the thin-film filter peeling-off step is performed. Then the thin-film filter 2 is manufactured. When the thin-film filter peeling-off step is performed, as illustrated in FIG. 27, the thin-film filter 2 is peeled off from the peeling-off adhesive layer 3 of the thin-film filter substrate 10 (this will be described later). Thereby the thin-film filter 2 is manufactured.

(Operation and Effect of the Thin-Film Filter and the Thin-Film Filter Substrate)

In the above-described thin-film filter 2, the stripes-formed inner wall surfaces 38 are formed inside the respective through holes 15. The stripes-formed inner wall surfaces 38 have respectively a plurality of stripe-like parts 37, the stripe-like parts 37 are formed along with the intersecting direction. Then, when air passes through the thin-film filter 2, the stream of air (passing stream) passes through inside the through holes 15, in the direction along with the stripe-like parts 37 (direction shown by "d7", "d8" in FIG. 7). Namely, because the stripe-like parts 37 have a function as a guide member, which adjusts a motion of the passing stream, passing through the through holes 15, in the intersecting direction, air stream, along with the direction different from the direction shown by d7, d8, is not formed. Therefore, peripheral parts of the respective through holes 15 are hardly affected by the passing stream, and they are hardly damaged. Because the thin-film filter 2 has a structure, which the passing stream passes through in the fixed direction, durability of the thin-film filter 2 is good.

Further, in the thin-film filter 2, hole forming process for the through holes 15 are performed by reactive ion etching. In reactive ion etching, etching proceeds by effect of both sputter operation by ion and chemical reaction. In this case, removed material (polyimide and so on, in case of the thin-film filter 2) is turned into volatile matter, and vacuum exhaust, including it, is performed. Therefore, production of debris and adhesion of debris are never occurred. Therefore, hole size of the respective through holes 15 never become uneven. Accordingly, in the thin-film filter 2, lowering the filtering function, originated in the manufacturing process, is never occurred, durability of the thin-film filter 2 is also good.

In case of the thin-film filter 2, because the stripe-like parts 37 are arranged in almost the whole of the inner surface of the respective through holes 15, almost the whole of the inner surface of the through holes 15 are guide member, durability of the thin-film filter 2 is good. Further, because the stripe-like parts 37 are formed in the size larger than 80% of the film thickness T, disturbance of the passing stream is not likely to occur, therefore the tripe-like parts 37 are good guide members.

Then, in the thin-film filter 2, the centers of the through holes 15, included in the second through hole-group 15B, are arranged between the centers of the adjacent through holes 15, included in the first through hole-group 15A. Therefore, in the thin-film filter 2, there is no waste of the arrangement of through holes 15. Further, the path of the air is secured effectively. Further, because the thin-film filter 2 has the high-density structure, the arrangement of through holes 15 is more effective without waste.

On the other hand, because the thin-film filter 2 is a member mainly having the thin-film part 16, made of polyamide or polyimide, it is difficult to handle the thin-film filter 2 separately. However, in case of the thin-film filter substrate 10, it has the silicon wafer 1, being formed in a plane shape, handling of the thin-film filter substrate 10, such as conveyance, storage or the like, is easy.

Moreover, the thin-film filter substrate 10 has the peeling-off adhesive layer 3, the thin-film filter 2 is peeled off from the silicon wafer 1, if necessary, thereby the thin-film filter 2 is able to be separated. The thin-film filter 2 is attached to a desired product, thereby the filtering function, that is demanded to the product, is exhibited. Therefore, the thin-film filter substrate 10 is very handy. Further, after the thin-film filter 2 is removed, the silicon wafer 1 is able to be used again as the base substrate which the thin-film filter 2 is formed, thereby a waste of materials and resources decreases.

Modified Example 1

Figure 12:
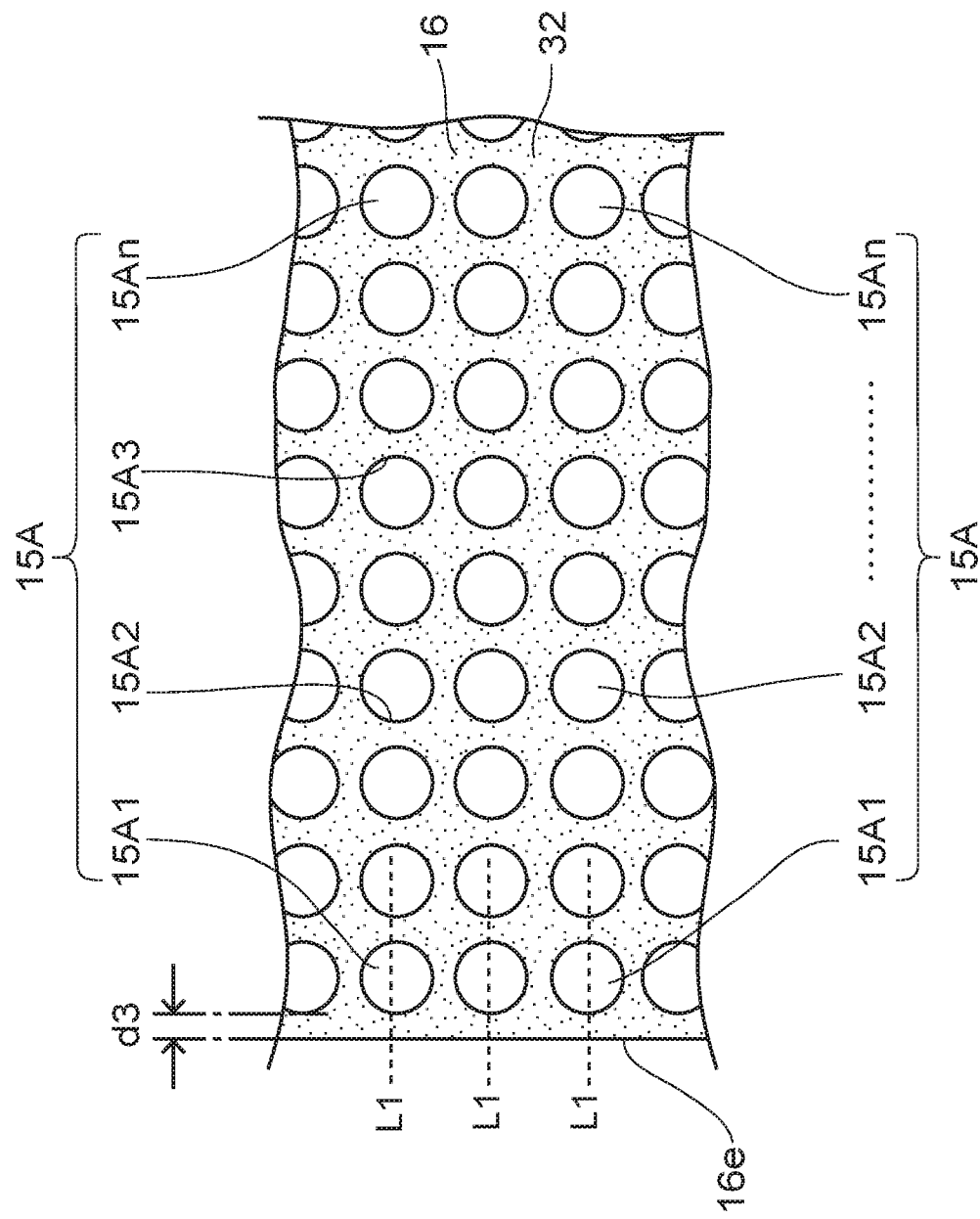
FIG. 12 is a plan view, with enlargement, of the principal part of the thin-film filter according to the modified example 1.
Figure 13:
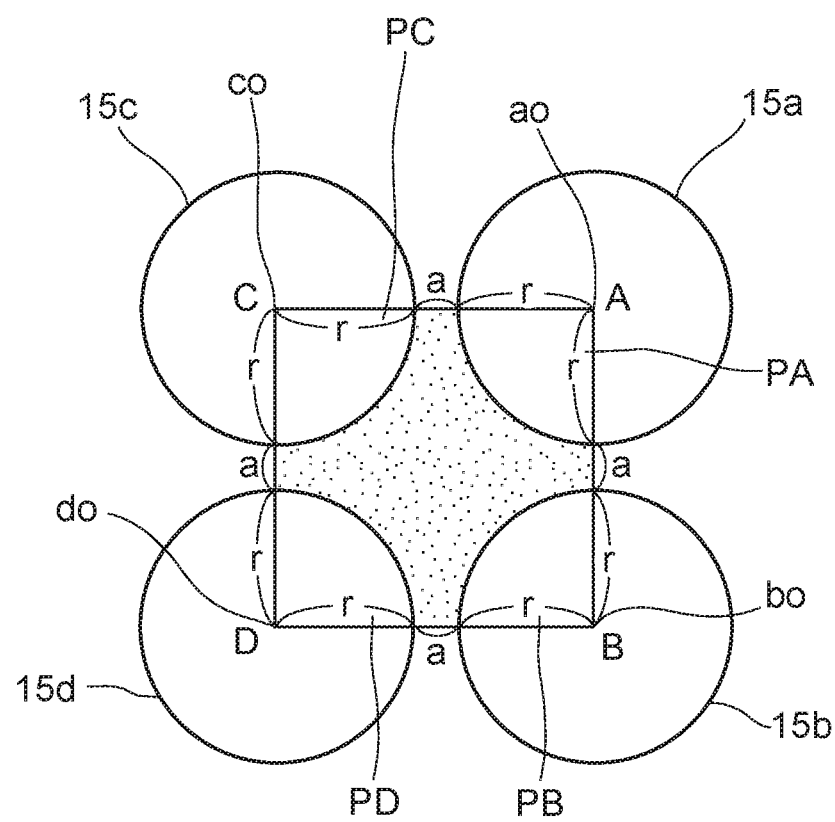
FIG. 13 is a plan view of the part, including a plurality of through holes, of the thin-film filter according to the modified example 1.

Next, the thin-film filter 32, according to a modified example 1, is explained with reference to FIG. 12, FIG. 13. FIG. 12 is a plan view showing a principal part of the thin-film filter 32 according to the modified example 1. FIG. 13 is a plan view showing a part, including representative through holes 15a, 15b, 15c, 15d, of the thin-film filter 32.

The thin-film filter 32 is different in that it has the first through hole-group 15A though, and it does not have the second through hole-group 15B, as compared with the thin-film filter 2. Because the thin-film filter 32 does not have the second through hole-group 15B, a plurality of the first lines L1 are arranged. Further, the first through hole 15A1, through holes 15A2, 15A3 . . . 15An, included in the each first line L1, are arranged at a constant interval in a straight line along with the direction intersecting vertically to the peripheral end part 16e. Furthermore, a plurality of first through holes 15A1, included in the each first line L1, are arranged at a constant interval in a straight line along with the peripheral end part 16e (similar with the through holes 15A2, 15A3 . . . 15An). All intervals between the first through holes 15A1 and the peripheral end part 16e are set an end-interval d3 having constant value.

In case of the thin-film filter 32, as illustrated in FIG. 13, the adjacent four through holes 15a, 15b, 15c, 15d are set as the representative through holes. The centers of the through holes 15a, 15b, 15c, 15d are a0, b0, c0, d0.

A rectangular ABCD is a rectangular, which the centers a0, b0, c0, d0 of a plurality of adjacent through holes 15(15a, 15b, 15c, 15d) included in the adjacent two first through hole-groups 15A, and the rectangular ABCD is a square, according to the regularity of the arrangement of the through holes 15.

The thin-film filter 32 has a plurality of through holes 15, similar with the thin-film filter 2, and the thin-film filter 32 is able to be manufactured by the same manufacturing method as the thin-film filter 2. The stripes-formed inner wall surfaces 38, similar with the thin-film filter 2, are formed inside the respective through holes 15 by reactive ion etching (not illustrated in FIG. 12, FIG. 13). Therefore, the thin-film filter 32 and the thin-film filter substrate (not illustrated), which the thin-film filter 32 is formed instead of the thin-film filter 2, have the same operation and effect as the above-described thin-film filter 2, the thin-film filter substrate 10.

Modified Example 2

Figure 14:
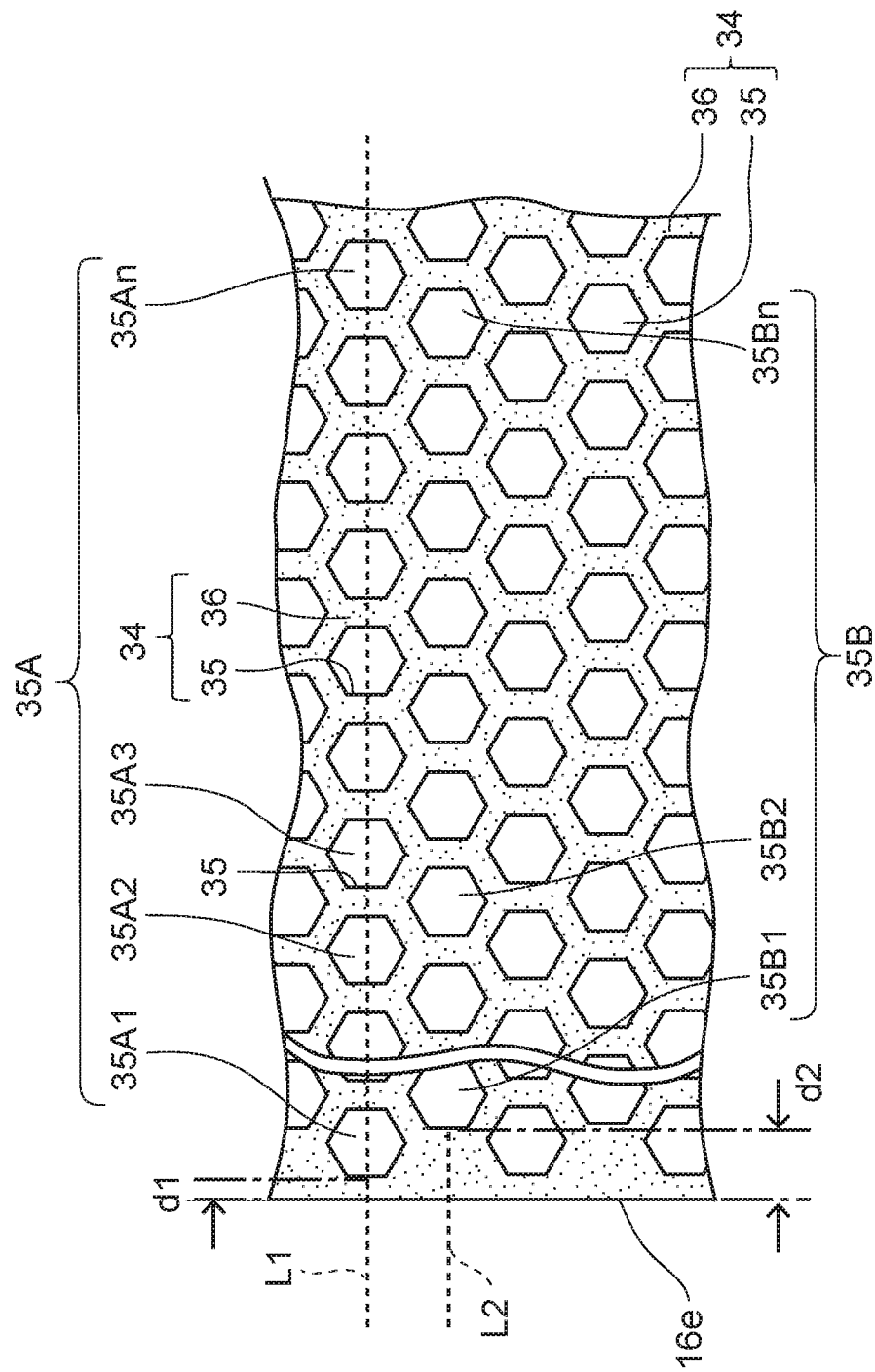
FIG. 14 is a plan view, with enlargement, of the principal part of the thin-film filter according to the modified example 2.
Figure 15:
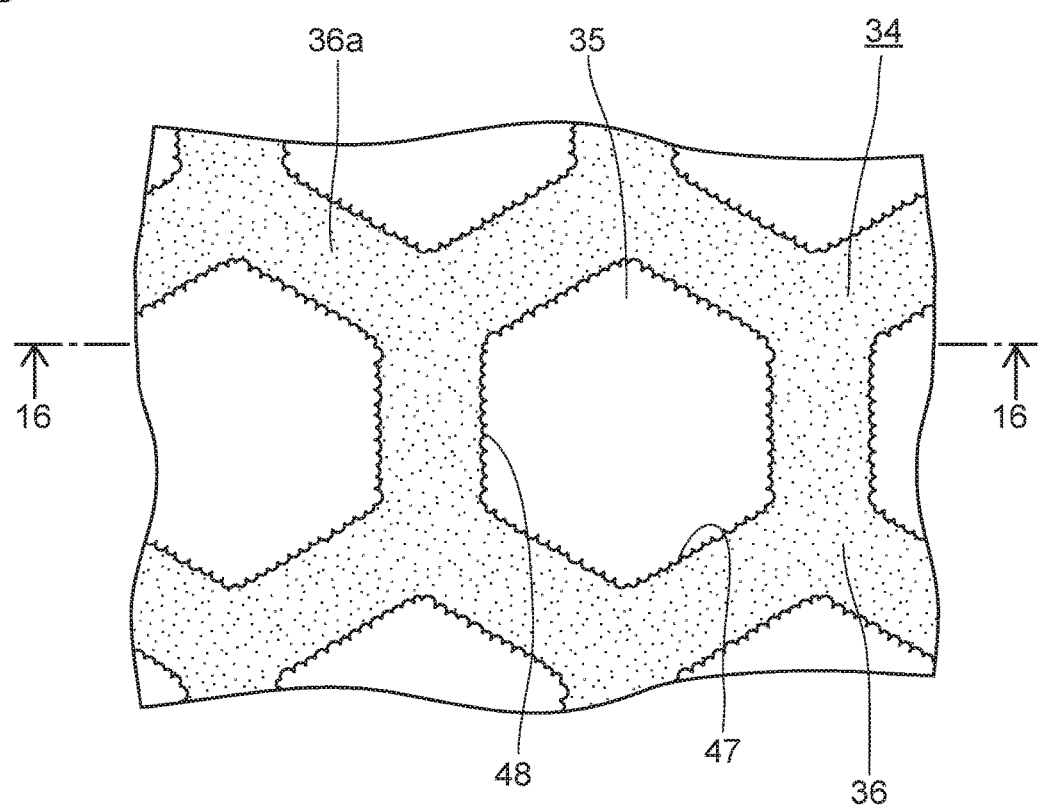
FIG. 15 is a plan view, with more enlargement, of the principal part of the thin-film filter according to the modified example 2.
Figure 16:
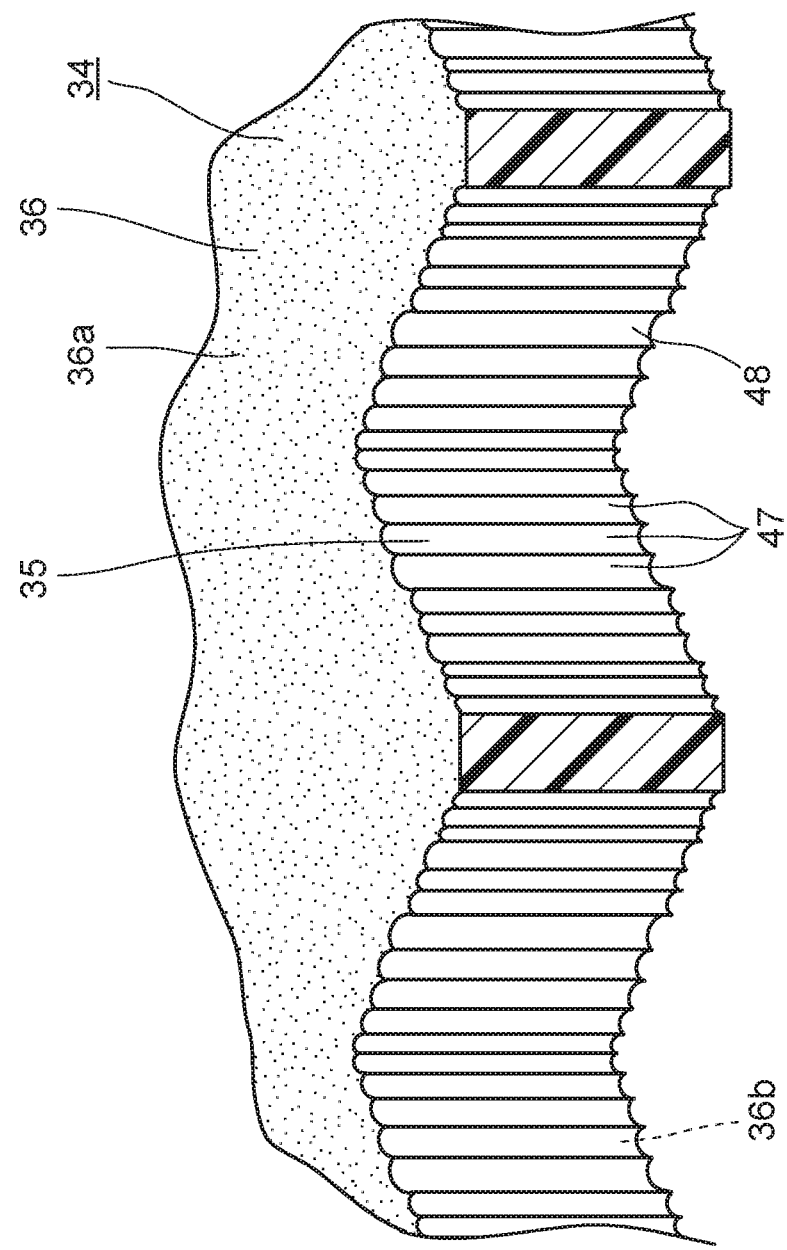
FIG. 16 is a perspective view showing a sectional surface corresponding to the line 16-16 in FIG. 15.

Next, the thin-film filter 34, according to a modified example 2, is explained with reference to FIG. 14, FIG. 15, FIG. 16. FIG. 14 is a plan view, with enlargement, of the principal part of the thin-film filter 34 according to the modified example 2. FIG. 15 is a plan view, with more enlargement, of the principal part of the thin-film filter 34. FIG. 16 is a perspective view showing a sectional surface corresponding to the line 16-16 in FIG. 15.

The thin-film filter 34 is different in that it has a thin-film part 36 instead of the thin-film part 16, and the through holes 35 are formed instead of the through holes 15, as compared with the thin-film filter 2. The thin-film part 36 is different in that the through holes 35 are formed, as compared with the thin-film part 16.

The above-described through holes 15 are formed in circular shape in a plan view though, the through holes 35 are formed in a regular hexagon in a plan view. The thin-film filter 34 has a first through hole-group 35A and a second through hole-group 35B. A plurality of through holes 35, including a first through hole 35A1, through holes 35A2, 35A3 . . . through hole 35An, are included in the first through hole-group 35A. The first line L1, similar with the first through hole-group 15A, is formed by the first through hole 35A1, through holes 35A2, 35A3 . . . 35An.

A plurality of through holes 35, including a second through hole 35B1, through holes 35B2, 35B3 . . . through hole 35Bn are included in the second through hole-group 35B. The second line L2, similar with the second through hole-group 15B, is formed by the second through hole 35B1, through holes 35B2, . . . 35Bn. In case of the thin-film filter 34, the triangle, which the centers of the adjacent three through holes 35 (for example, through holes 35A2, 35A3, 35B3) is a regular triangle, according to the regularity of the arrangement of the through holes 35.

Then, in case of the thin-film filter 34, as illustrated in FIG. 15, FIG. 16, the stripes-formed inner wall surfaces 48 are formed inside the respective through holes 35. The stripes-formed inner wall surfaces 48 have a plurality of stripe-like parts 47. A plurality of stripe-like parts 47 are arranged in almost the whole of the inner surface of the respective through holes 35, similar with a plurality of stripe-like parts 37. The stripes-formed inner wall surfaces 48 are formed in almost the whole of the inner surface of the respective through holes 35. The stripe-like parts 47 are formed along with the intersecting direction, similar with the stripe-like parts 37. Further, the respective stripe-like parts 47 are convex parts or concave parts, formed on the inner surface of the respective through holes 35, approximately in the straight line along with the intersecting direction.

The thin-film filter 34 has a plurality of through holes 35. The stripe-like parts 47 and the stripes-formed inner wall surfaces 48, respectively similar with the stripe-like parts 37 and the stripes-formed inner wall surface 38 of the through hole 15, are formed in the respective through holes 35. Therefore, the thin-film filter 34 and the thin-film filter substrate (not illustrated), which the thin-film filter 34 is formed instead of the thin-film filter 2, have the same operation and effect similar with the above-described thin-film filter 2 and the thin-film filter substrate 10.

Modified Example 3

Figure 17:
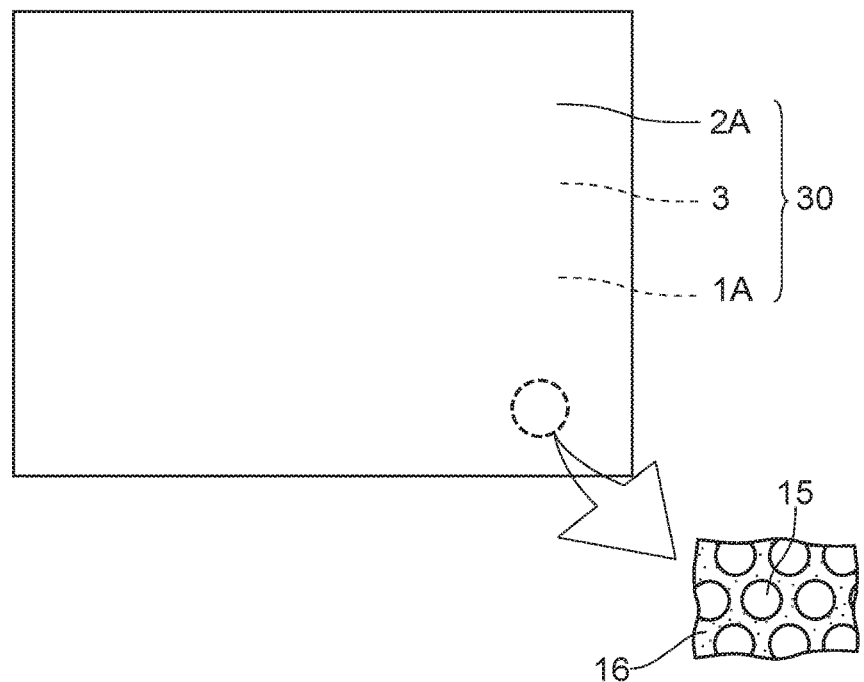
FIG. 17(a) is a plan view of a principal part of the thin-film filter substrate according to the modified example 3.
FIG. 17(b) is a perspective view showing the thin-film filter, included in the thin-film filter substrate and a reel member.
Figure 17:
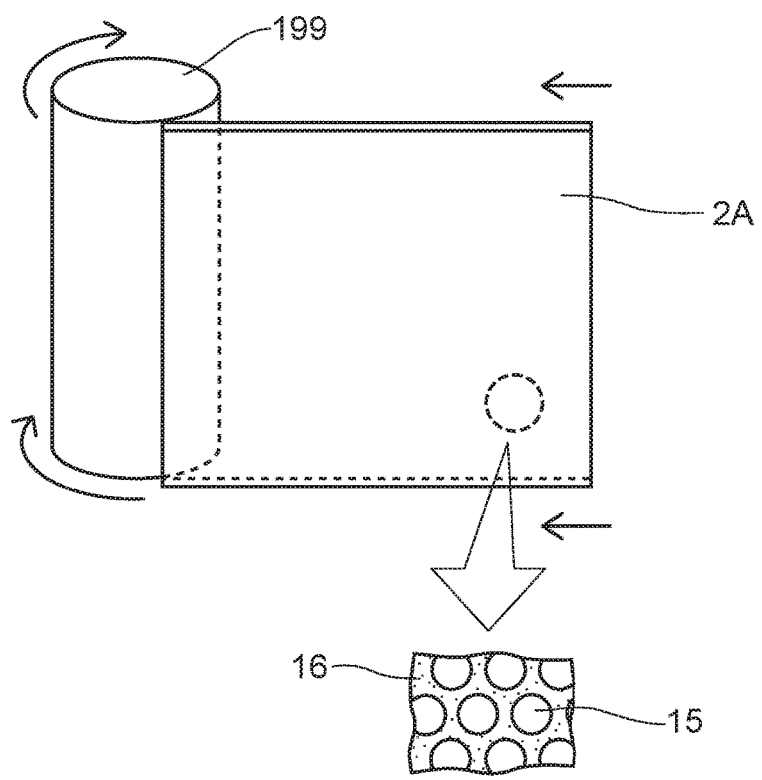

Next, the thin-film filter substrate 30, according to a modified example 3, is explained with reference to FIG. 17. FIG. 17(a) is a plan view of a principal part of the thin-film filter substrate 30 according to the modified example 3. FIG. 17(b) is a perspective view showing the thin-film filter 2A, included in the thin-film filter substrate 30 and a reel member 199.

The thin-film filter substrate 30 has a filter panel 1A, as a base substrate, a thin-film filter 2A and the peeling-off adhesive layer 3.

The filter panel 1A is made of glass, and it is formed in a rectangular shape. The peeling-off adhesive layer 3 is formed on the base surface, being one side surface, of the filter panel 1A, and the thin-film filter 2A is formed on the peeling-off adhesive layer 3.

The thin-film filter 2A is different in its shape from the thin-film filter 2. The thin-film filter 2 is formed in a circular shape in accordance with the silicon wafer 1 though, the thin-film filter 2A is formed in a rectangular shape in accordance with the filter panel 1A. The thin-film filter 2A has the thin-film part 16 similar with the thin-film filter 2, a plurality of through holes 15 are formed uniformly on the thin-film part 16 by a regular arrangement. The stripes-formed inner wall surfaces 38, similar with the thin-film filter 2, are formed inside the respective through holes 15 (not illustrated in FIG. 17). The stripes-formed inner wall surface 38 of the thin-film filter 2A has a plurality of stripe-like parts 37, similar with the thin-film filter 2.

Because the through holes 15, the stripes-formed inner wall surfaces 38 and the stripe-like parts 37 are formed in the thin-film filter 2A similar with the thin-film filter 2, the thin-film filter 2A have the same operation and effect as the thin-film filter 2. Further, when the filter panel 1A is used instead of the silicon wafer 1, the thin-film filter substrate 30 is manufactured by the manufacturing method similar with the manufacturing method of thin-film filter substrate 10. Further, because the manufactured thin-film filter substrate 30 has the peeling-off adhesive layer 3, the thin-film filter 2A is peeled off, similar with the thin-film filter 2, and the thin-film filter 2A is transcribed to the desired product, thereby the filtering function is exhibited.

On the other hand, the thin-film filter 2A and the reel member 199, having a cylindrical shape, are shown in the FIG. 17(b). Then, rotating the reel member 199 is performed in accordance with the peeling off the thin-film filter 2A from the thin-film filter substrate 30, thereby the thin-film filter 2A is able to be reeled in the reel member 199. The peeling-off adhesive layer 3 is previously formed on the reel member 199.

Handling of the thin-film filter 2A, that is peeled off from the thin-film filter substrate 30, is difficult though, when the thin-film filter 2A is reeled in the reel member 199, handling of the thin-film filter 2A is easy. Further, in case of the thin-film filter substrate 30, because the filter panel 1A is a member formed in a plan shape, storage of the filter panel 1A, in a standing condition, is difficult. In this point, because the reel member 199 is formed in a cylindrical shape, the reel member 199 is suitable for storage of the thin-film filter 2A in a standing condition.

Modified Example 4

Figure 18:
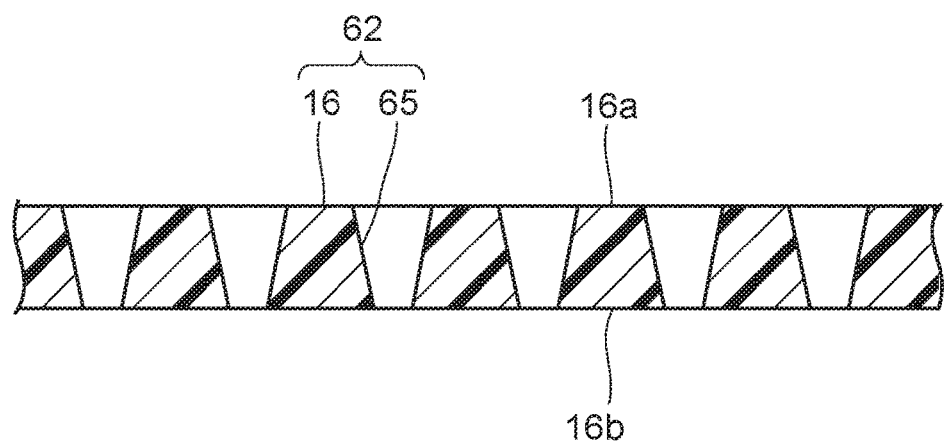
FIG. 18 is a sectional view of the thin-film filter according to the modified example 4, corresponding to FIG. 5.

Next, the thin-film filter 62, according to a modified example 4, is explained with reference to FIG. 18. FIG. 18 is a sectional view of the thin-film filter 62 according to the modified example 4, corresponding to FIG. 5.

The thin-film filter 62 is different in that it has through holes 65 instead of the through holes 15, as compared with the thin-film filter 2. In case of the through holes 15, they respectively have fixed size diameters from the film surface 16a to the rear film surface 16b. To the contrary, in case of the through holes 65, the diameters are gradually reduced from the film surface 16a to the rear film surface 16b. Because the stripes-formed inner wall surfaces 38 are formed in the respective through holes 65 (not illustrated in FIG. 18), similar with the through holes 15, the thin-film filter 62 has the same operation and effect, similar with the thin-film filter 2.

Modified Example 5

Figure 19:
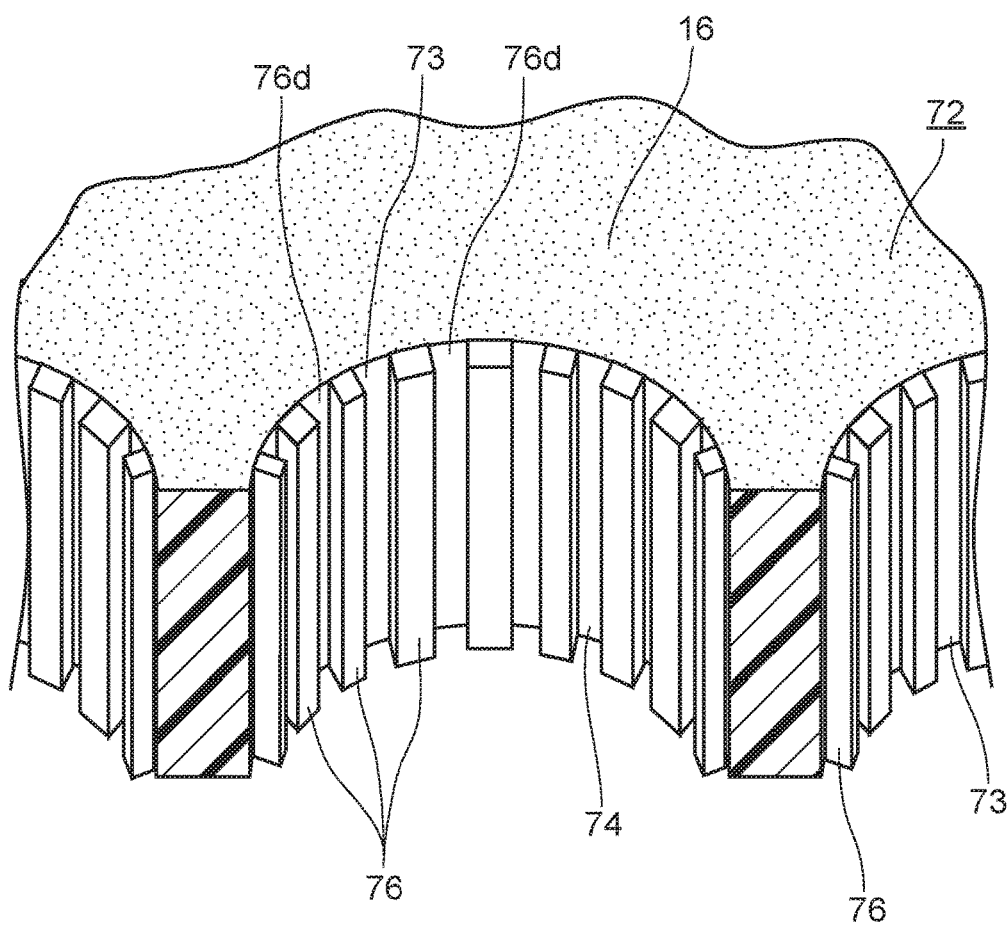
FIG. 19 is a perspective view of the thin-film filter according to the modified example 5, corresponding to FIG. 7.

Next, the thin-film filter 72, according to a modified example 5, is explained with reference to FIG. 19. FIG. 19 is a perspective view of the thin-film filter 72 according to the modified example 5.

The thin-film filter 72 is different in that it has through holes 73 instead of the through holes 15, as compared with the thin-film filter 2. Further, in case of the thin-film filter 72, the stripes-formed inner wall surfaces 74 are formed in the respective through holes 73.

In case of the above-described stripes-formed inner wall surfaces 38, the stripe-like parts 37 are formed closely so that a smooth part does not remain in the inner surface of the respective through holes 15. To the contrary, in case of the stripes-formed inner wall surfaces 74, stripe-like convex parts 76 are formed discretely at interval 76d so that a smooth part remains in the inner surface of the respective through holes 73. Therefore, parts between the respective stripe-like convex parts 76 remain as the smooth part. The stripe-like convex parts 76 are convex parts formed in the inner surface of the through holes 73, and they are formed in about straight line along with the intersecting direction. Therefore, the passing stream passes through in the fixed direction by the stripe-like convex parts 76 of the stripes-formed inner wall surfaces 74, the thin-film filter 72 have the same operation and effect, similar with the thin-film filter 2.

Embodiment of the MEMS Microphone

Figure 20:
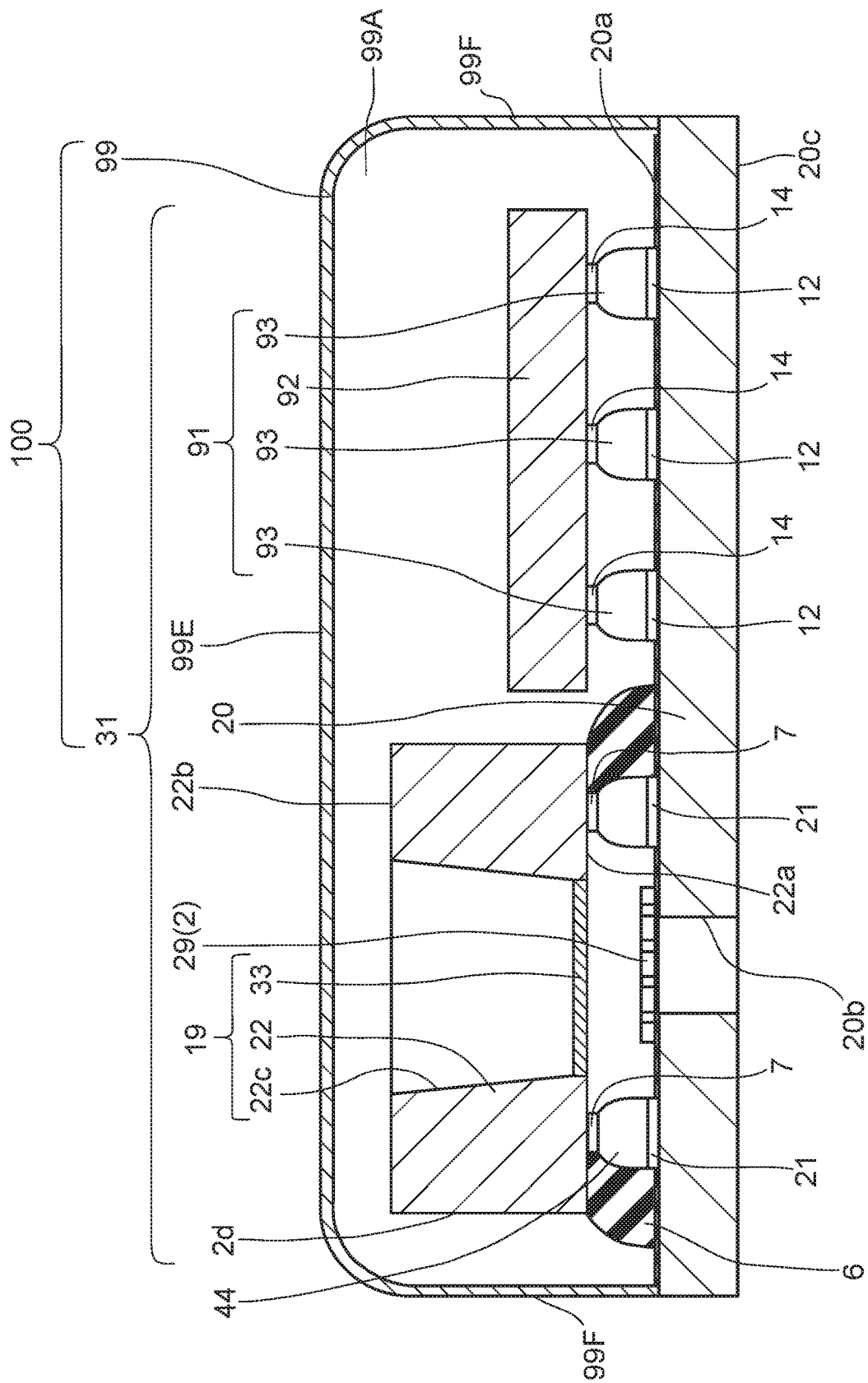
FIG. 20 is a sectional view showing a part, corresponding to the line 20-20 in FIG. 22, of a MEMS microphone according to the embodiment of the present invention.
Figure 21:
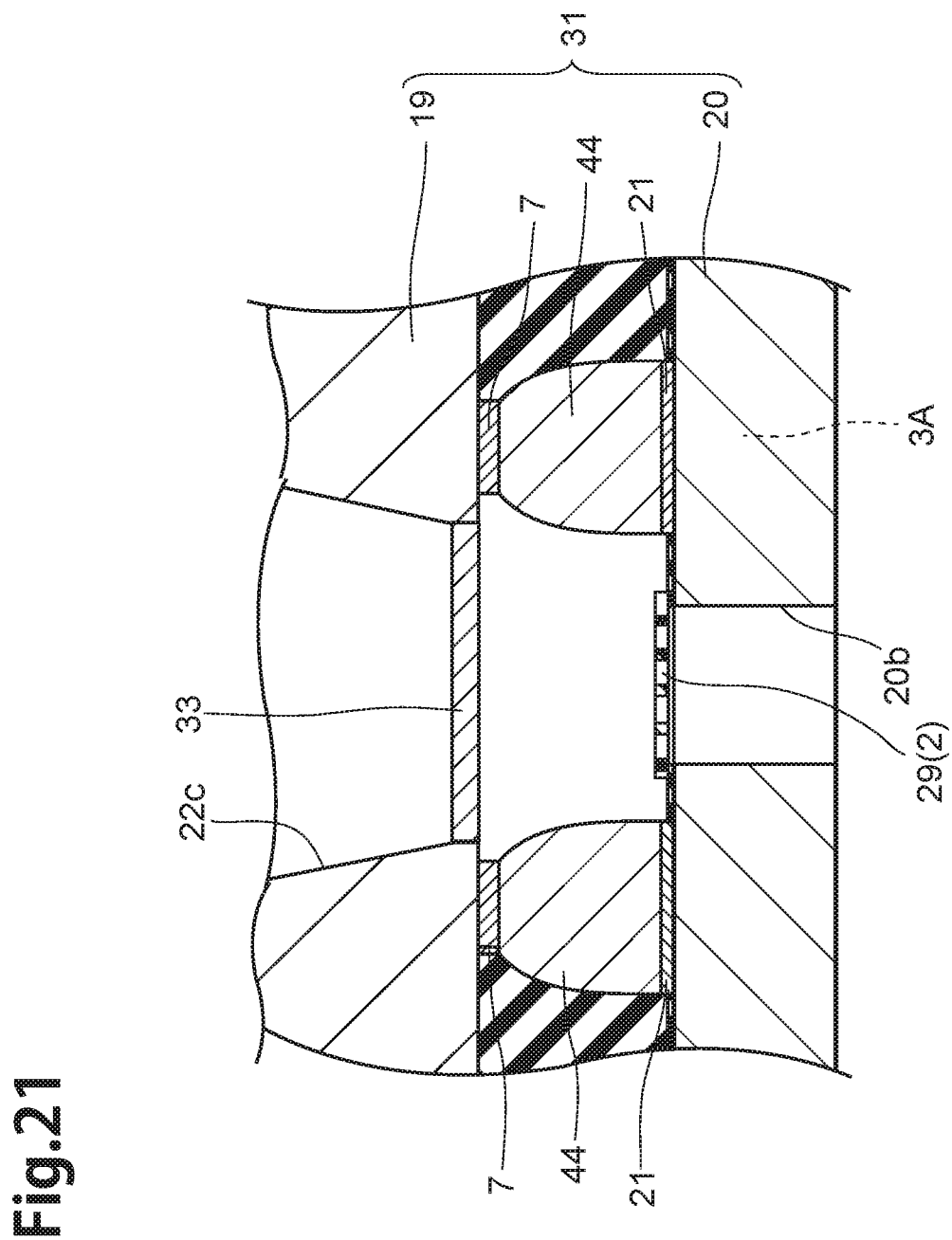
FIG. 21 is a sectional view, with enlargement, showing a principal part in FIG. 20.
Figure 22:
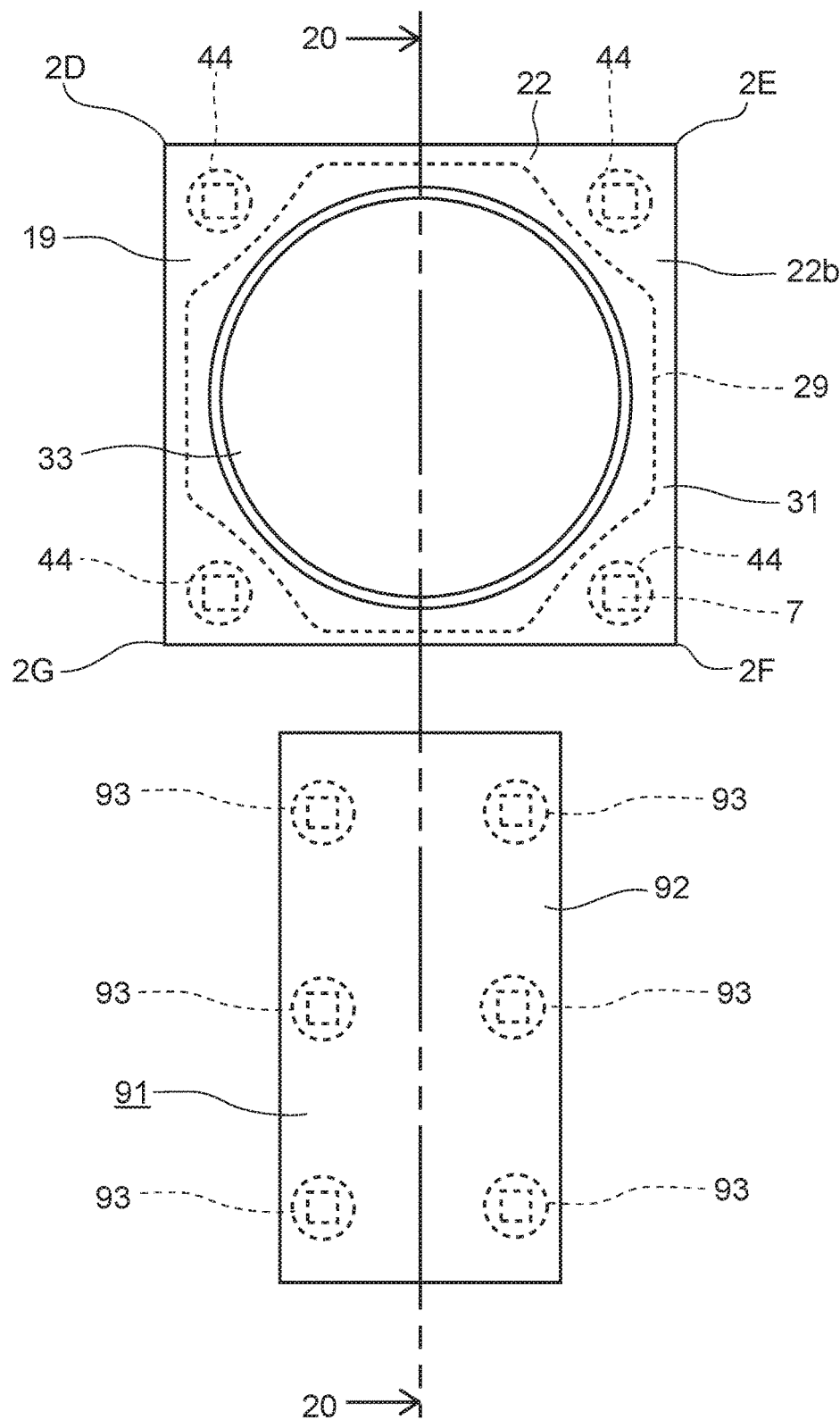
FIG. 22 is a plan view showing a principal part of the MEMS microphone, which a cap is removed, according to the embodiment of the present invention.

Subsequently, embodiment of a MEMS microphone will be explained with reference to FIG. 20 to FIG. 22. FIG. 20 is a sectional view of a part corresponding to the line 20-20 in FIG. 22 showing the MEMS microphone 100 according to the embodiment of the present invention. FIG. 21 is a sectional view, with enlargement, showing a principal part in FIG. 20. FIG. 22 is a plan view showing a principal part of the MEMS microphone 100, which a cap 99 is removed.

As illustrated in FIG. 20, the MEMS microphone 100 has a MEMS package 31 and the cap 99.

The MEMS package 31 has a MEMS chip 19, a package substrate 20 which the MEMS chip 19 is adhered, bonding bumps 44, a thin-film filter 29 and a sound shield 6. Further, the MEMS package 31 has an ASIC (Application Specific Integrated Circuit) package 91.

The MEMS chip 19 has an element substrate 22 which a membrane 33, as a movable element, is formed. The MEMS chip 19 is used as the microphone of capacitance-type. The element substrate 22 is a substrate formed in a rectangular-shape in a plan view, as illustrated in FIG. 22, and it is formed with silicon. A hole part 22c is formed in the center of the element substrate 22. The hole part 22c is formed in a cylindrical-shape from an upper surface 22b (outside surface of the element substrate 22) of the element substrate 22 to an opposing surface 22a (the surface opposing to the package substrate 20), and the membrane 33 is formed in the opposing surface 22a side of the hole part 22c. Note that two thin-films, which are called back-plates (not illustrated), are arranged in the upper side and the lower side of the membrane 33.

As illustrated in FIG. 20, the bonding bumps 44 are solder bumps adhered to both the opposing surface 22a and the package substrate 20. As illustrated in FIG. 22, the four bonding bumps 44 are respectively arranged in a neighborhood of corner parts 2D, 2E, 2F, 2G.

The membrane 33 is a vibration film formed approximately in a circular shape, and it is a thin-film made of an inorganic metal such as $SiO_2$, SiN or the like.

The bonding bumps 44 are solder bumps made of solder. As illustrated in FIG. 20, the all four bonding bumps 44 are adhered to both the MEMS chip 19 and the package substrate 20. Namely, the four bonding bumps 44 are adhered to electrode pads 7, formed in the opposing surface 22a, and electrode pads 21 formed in a package surface 20a (surface of the MEMS chip 19 side of the package substrate 20) of the package substrate 20. The four bonding bumps 44 connect the MEMS chip 19 electrically and fixedly to the package substrate 20.

In the MEMS microphone 100, the thin-film filter 29 is formed on the package substrate 20, so as to close a later-described sound-hole 20b. The thin-film filter 29 is formed with the above-described thin-film filter 2. The thin-film filter 29 is formed in a modified rectangular shape which the four corner parts are removed, as illustrated in FIG. 22. A later-described photosensitive-adhesive layer 61 is formed in the peripheral of the sound-hole 20b. The thin-film filter 29 is adhered on the package surface 20a of the package substrate 20 by the photosensitive-adhesive layer 61.

The sound shield 6 is made of silicone resin and so on. The sound hole shield 6 is formed between the MEMS chip 19 and the package substrate 20 so as to surround the MEMS chip 19.

The package substrate 20 is a board like member made of such as silicon, ceramic or the like (or PCB: Printed Circuit Board). The electrode pads 21 and electrode pads 12 are formed on the package surface 20a of the package substrate 20. The MEMS chip 19 is mounted on the part, of the package surface 20a, which the electrode pads 21 are formed, the ASIC package 91 is mounted on the part which the electrode pads 12 are formed. Further, the sound hole 20b is formed on the part, of the package substrate 20, which the MEMS chip 19 is mounted. The sound hole 20b penetrates the package substrate 20 from the package surface 20a to a bottom surface 20c on the opposite side.

The ASIC package 91 has an ASIC 92 and bonding bumps 93. The ASIC 92, for example, is an integral circuit which amplifies an output signal of the MEMS chip 19 (an integral circuit which outputs displacement of a capacitance as displacement of the voltage in the MEMS chip 19). Electrode pads 14 are formed lower side of the ASIC 92. The electrode pads 14 are connected to the electrode pads 12 of the package surface 20a by the bonding bumps 93. The ASIC 92 is mounted on the package substrate 20.

The cap 99 covers the MEMS package 31. The cap 99 is adhered to the package surface 20a with not illustrated adhesive (or by soldering). A space 99A is secured by the cap 99 and the package substrate 20, the MEMS package 31 is accommodated in the space 99A.

(Method of Manufacturing the MEMS Microphone)

Figure 24:
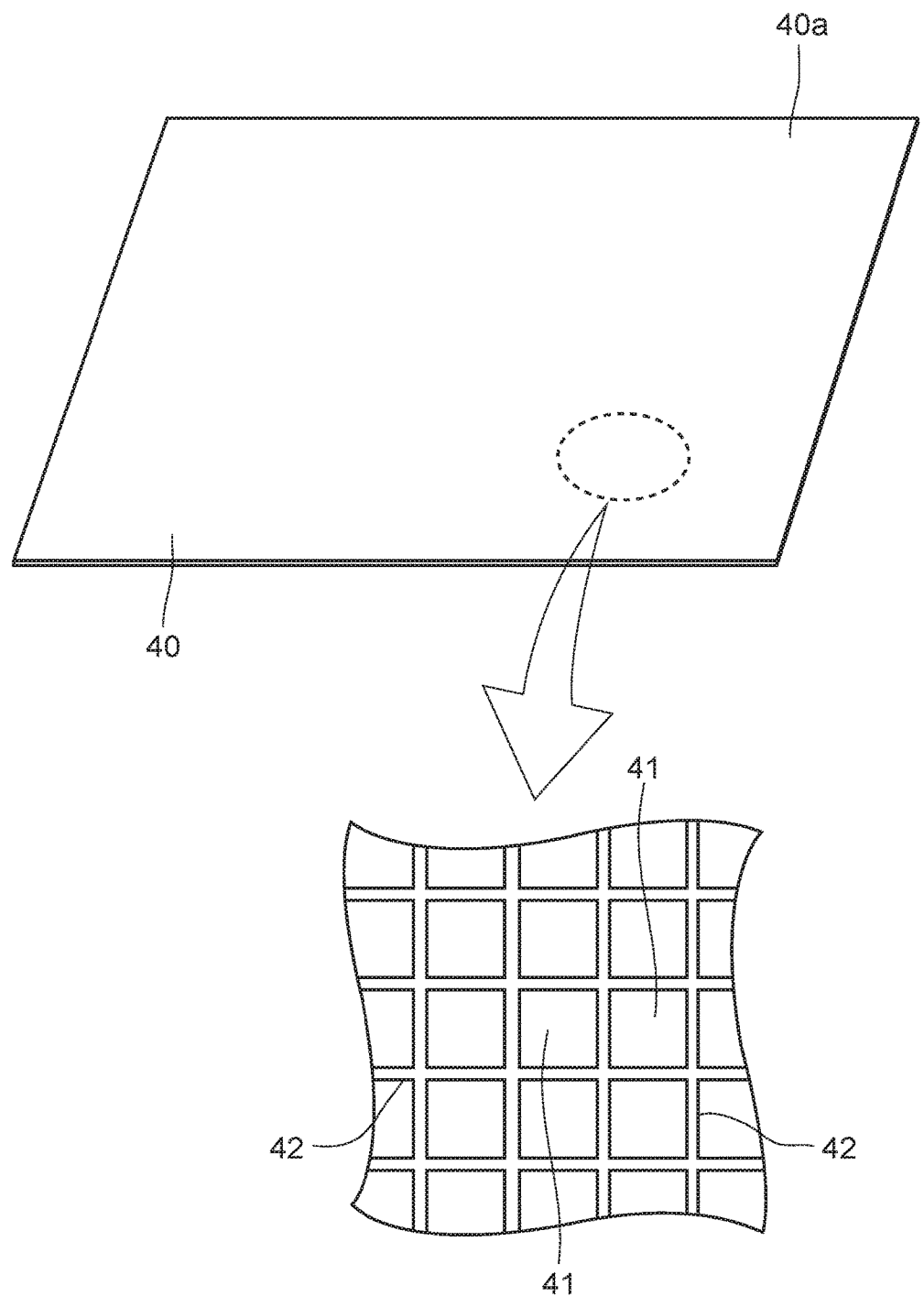
FIG. 24 is a perspective view showing a package-panel.
Figure 25:
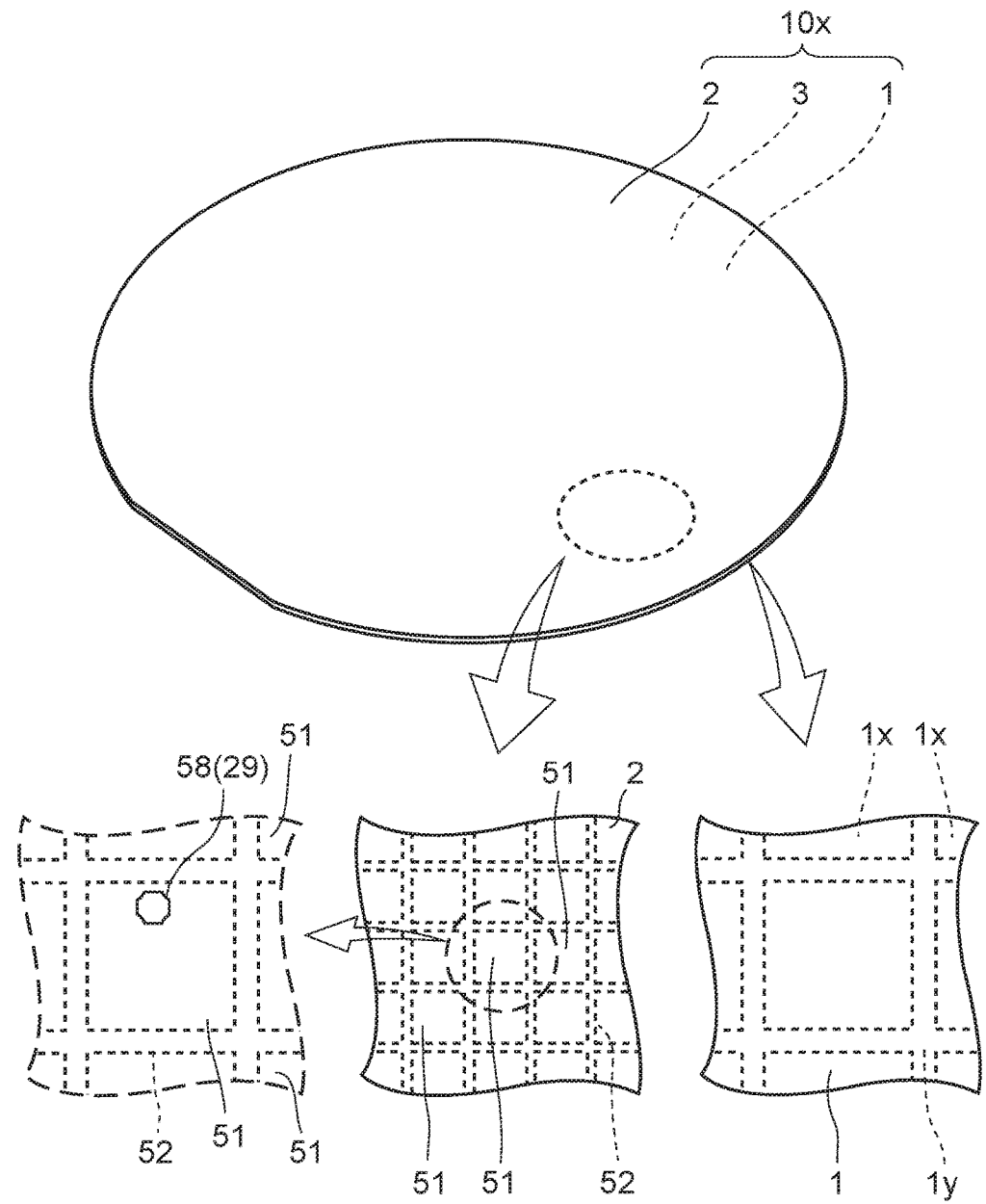
FIG. 25 is a perspective view showing the thin-film filter substrate.

Subsequently, the method of manufacturing the MEMS microphone 100, having the above structure, will be explained with reference to FIG. 24 to FIG. 29. Here, FIG. 24 is a perspective view showing the later-described package-panel 40, FIG. 25 is a perspective view showing the later-described thin-film filter substrate 10X. FIGS. 26-29 are sectional views showing principal parts of a respective photosensitive-adhesive layer forming step, a thin-film filter peeling off step and a thin-film filter transcribing step.

In the Method of manufacturing the MEMS microphone 100, the MEMS microphone 100 is manufactured with the above-described MEMS chip 19, the ASIC 92 and the package substrate 20 which the MEMS chip 19 and the ASIC 92 are adhered. In case of the method of manufacturing according to the embodiment, the MEMS chip 19 (rectangular MEMS chip), having the rectangular element substrate 22, is used. In the Method of manufacturing the MEMS microphone 100, the package-panel 40, illustrated in FIG. 24, and the thin-film filter substrate 10X, as illustrated in FIG. 25, are used. In the Method of manufacturing the MEMS microphone 100, the photosensitive-adhesive layer forming step, the thin-film filter peeling off step and the thin-film filter transcribing step are performed.

As illustrated in FIG. 24, the package-panel 40 is a board-like member, having rectangular shape, made of PCB or ceramic, and a plurality of package-regions 41 are formed on the surface 40a by a regular arrangement. When the package-panel 40 is divided along with divided lines 42, the package substrate 20 is manufactured from each package region 41 (about 600 package substrates 20 are manufactured by every package-panel 40).

As illustrated in FIG. 25, the thin-film filter substrate 10X has the silicon wafer 1 (a substrate made of glass, quartz is able to be used), the thin-film filter 2 and the peeling-off adhesive layer 3. The thin-film filter substrate 10X is manufactured by performing the above-described the thin-film filter substrate manufacturing step. The thin-film filter substrate manufacturing step, for manufacturing the thin-film filter substrate 10X, has the above-described peeling-off adhesive layer forming step and the thin-film filter forming step.

Then the thin-film filter substrate 10X has a specific use which the thin-film filter substrate 10X is used for the MEMS microphone 100. Therefore, in case of the thin-film filter substrate 10X, the silicon wafer 1 has a plurality of separative regions 1X, and the thin-film filter 2 has a plurality of filter regions 51.

A plurality of separative regions 1X are formed by a regular arrangement in accordance with the package regions 41 of the package-panel 40. The parts between the respective separative regions 1X are divided lines 1y in accordance with the divided lines 42. Further, a plurality of filter regions 51 are also formed by a regular arrangement in accordance with the package regions 41 of the package-panel 40. The filter regions 51 are formed in accordance with the separative regions 1X. The parts between the respective filter regions 51 are divided lines 52 in accordance with the divided lines 42. When the thin-film filter 2 is divided along with the divided lines 52, a plurality of filter regions 51 are formed. Therefore, the above-described plurality of through holes 15 and the stripes-formed inner wall surfaces 38 are formed in the respective filter regions 51.

As illustrated in FIG. 25, filter parts 58 are arranged in the respective filter region 51. The respective filter parts 58 becomes the above-described thin-film filter 29 later. Therefore, the respective filter parts 58 are formed in a modified rectangular shape in accordance with the thin-film filter 29.

Then, the MEMS microphone 100 is manufactured with the package panel 40 and the thin-film filter substrate 10X. The MEMS microphone 100 is manufactured by performing the later-described photosensitive-adhesive layer forming step, the thin-film filter peeling-off step and the thin-film filter transcribing step.

Figure 26:
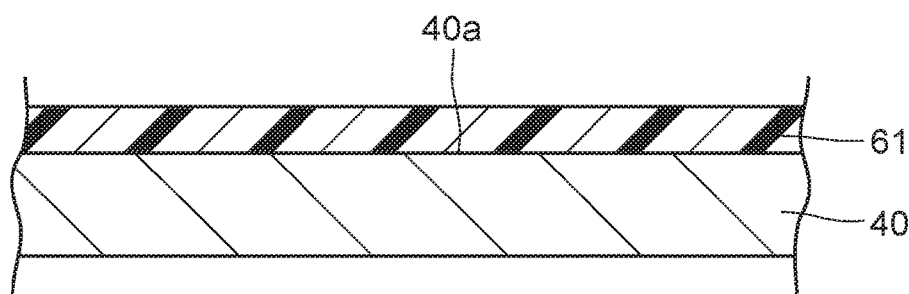
FIG. 26 is a sectional view showing a principal part of a photosensitive-adhesive layer forming step.
Figure 28:
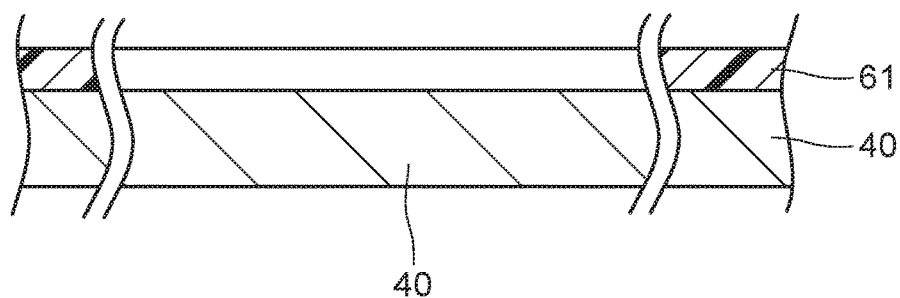
FIG. 28 is a sectional view showing another principal part of the photosensitive-adhesive layer forming step.

At first, the photosensitive-adhesive layer forming step is performed. In the photosensitive-adhesive layer forming step, as illustrated in FIG. 26, a photosensitive-adhesive layer 61 is formed on the surface 40a of the package-panel 40. The photosensitive-adhesive layer 61 is formed by applying photosensitive polyimide adhesive sheet and so on. In this case, as illustrated in FIG. 28, the photosensitive-adhesive layer 61 is formed in a hole-formed structure. In the hole-formed structure, a part, which the sound hole 20b will be formed later, is removed.

Next, thin-film filter peeling-off step is performed. In the thin-film filter peeling-off step, the thin-film filter substrate 10X is heated. Then, as illustrated in FIG. 27, the peeling-off adhesive layer 3 is foamed by that heat. Therefore, the thin-film filter 2(29) is peeled off from the peeling-off adhesive layer 3, together with the metal pattern 5A.

Figure 29:
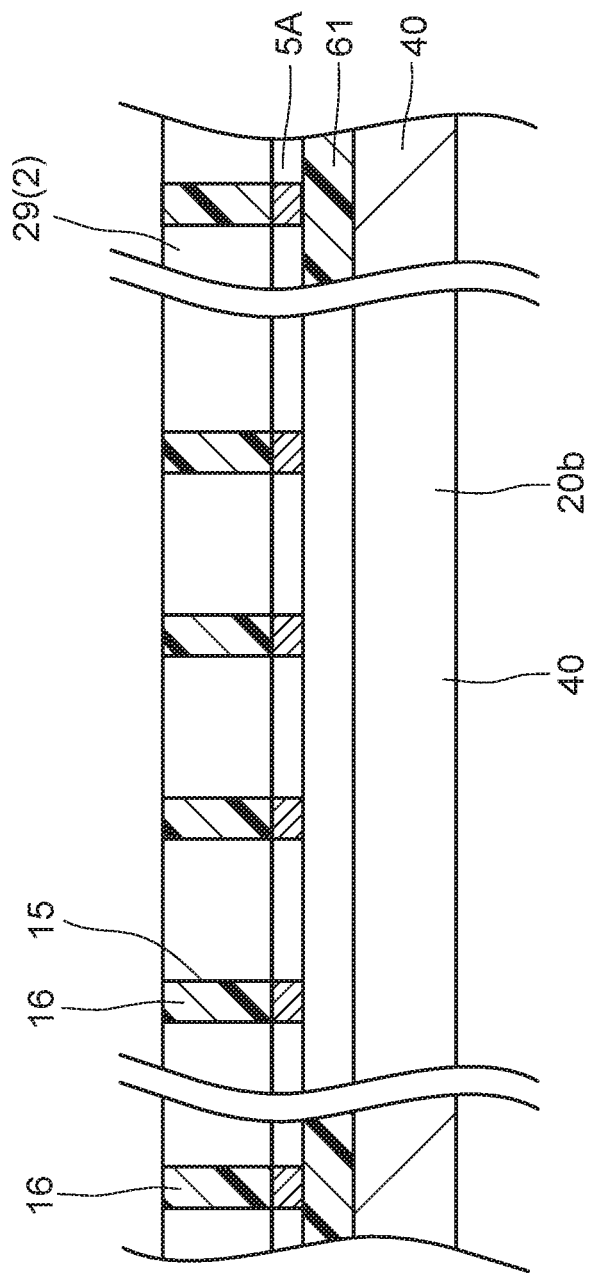
FIG. 29 is a sectional view showing a thin-film filter transcribing step.

Subsequently, the thin-film filter transcribing step is performed. As described-above, because the photosensitive-adhesive layer 61 is formed on the surface 40a of the package-panel 40. Therefore, when the thin-film filter 2(29), peeled off from the thin-film filter substrate 10X, is laminated on the package panel 40, as illustrated in FIG. 29, the thin-film filter 2(29) are overlaid on the photosensitive-adhesive layer 61 together with the metal pattern 5A. In this way, the thin-film filter 2(29) is transcribed on the package-panel 40.

Then, a plurality of package-regions 41 are formed on the package-panel 40. In the respective package-regions 41, unnecessary parts of the thin-film filter 2 are removed by a laser-processing. In this case, in the respective package-regions 41, the part, being used for the thin-film filter 29, of thin-film filter 2, are saved as a filter part 58, the other parts are removed. In this way, the thin-film filter 29 is formed so as to cover the sound hole 20b.

Figure 30:
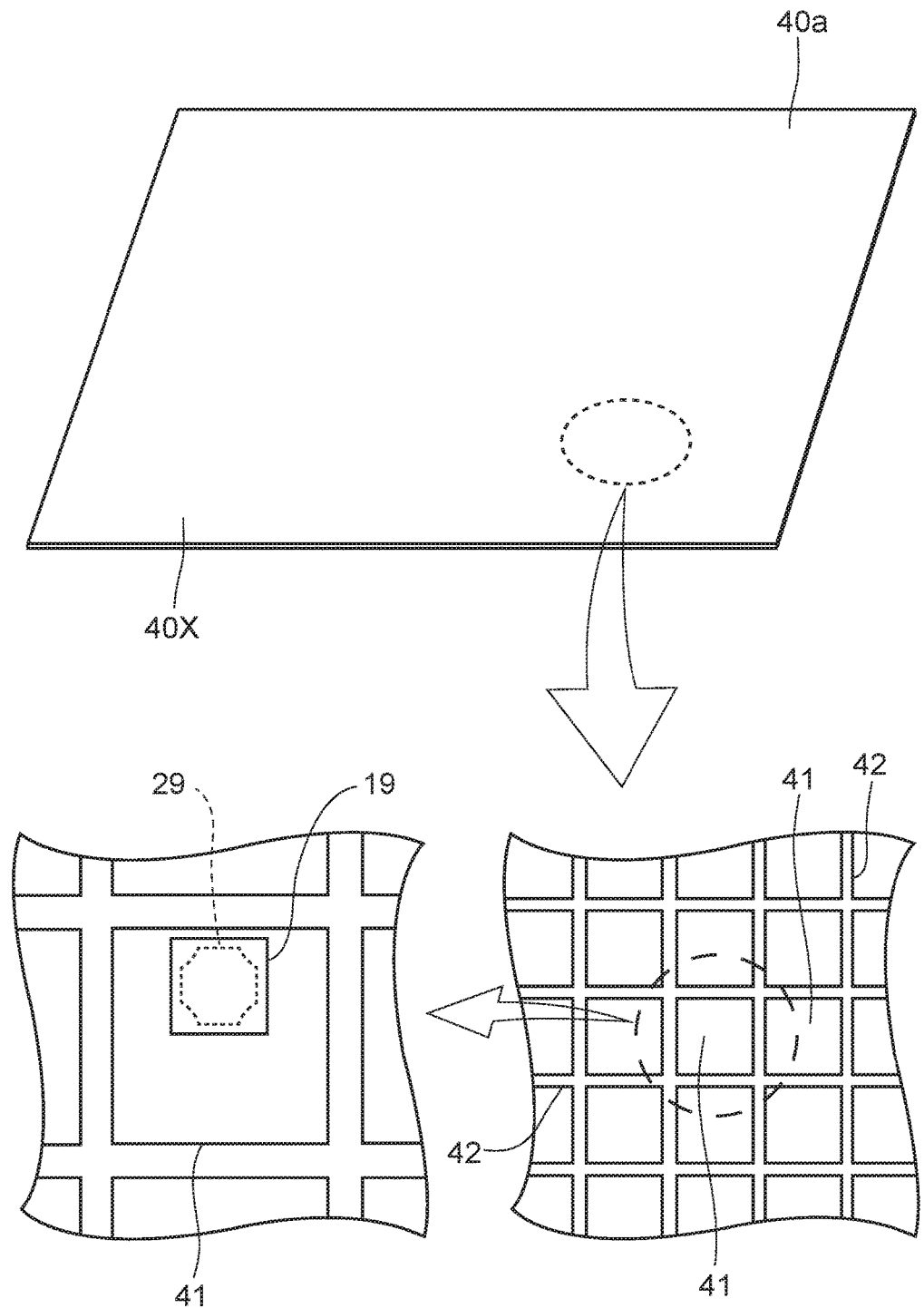
FIG. 30 is a perspective view showing a panel-with-chip according to the embodiment of the present invention.

After that, the MEMS chip mounting step is performed. In the MEMS chip mounting step, the electrode pads 7 are formed on the MEMS chip 19, further the solder bumps are formed. After that, in the package-panel 40, the MEMS chips 19 are mounted respectively on the package-regions 41 by the flip chip bonding with solder bumps to form the panel-with-chip 40X (see FIG. 30). The panel-with-chip 40X is put into the not-illustrated heating reflow furnace. Then the solder bumps become the bonding bumps 44 after melting. After that, the sound shield 6 is formed (the sound shield 6 is sometimes formed before the MEMS chips 19 are mounted).

After that, the ASIC 92 is mounted on the package-region 41, further the cap 99 is adhered. Note that a package reflow is able to be performed about both the MEMS chip 19 and ASIC 92, when the ASIC 92 is mounted on the panel-with-chip 40X.

Furthermore, a panel cutting step is performed. In the panel cutting step, the panel-with-chip 40X, which the MEMS chip 19 and ASIC 92 are mounted further the cap 99 is covered, is cut along with the divided lines 42 to be divided into the respective package-regions 41. Then, the panel-with-chip 40X is divided into a plurality of package-regions 41. The MEMS microphone 100 is manufactured together with the package substrate 20 from the respective package-regions 41. The above-described thin-film filter 29 is formed in the manufactured package substrate 20.

Because the thin-film filter 29 is formed in the MEMS microphone 100, the particles and water are able to be kept out surely by the thin-film filter 29. A plurality of through holes 15 are formed in the thin-film filter 29, the stripes-formed inner wall surfaces 38 are formed inside the respective through holes 5. A plurality of through holes 15 are formed with reactive ion etching so as to form the stripes-formed inner wall surfaces 38. Therefore, lowering the filtering function, originated in the manufacturing process, for example such a hole closing by adhesion of debris, is never occurred. Further, durability of the thin-film filter 29 is also good.

Modified Example

Figure 23:
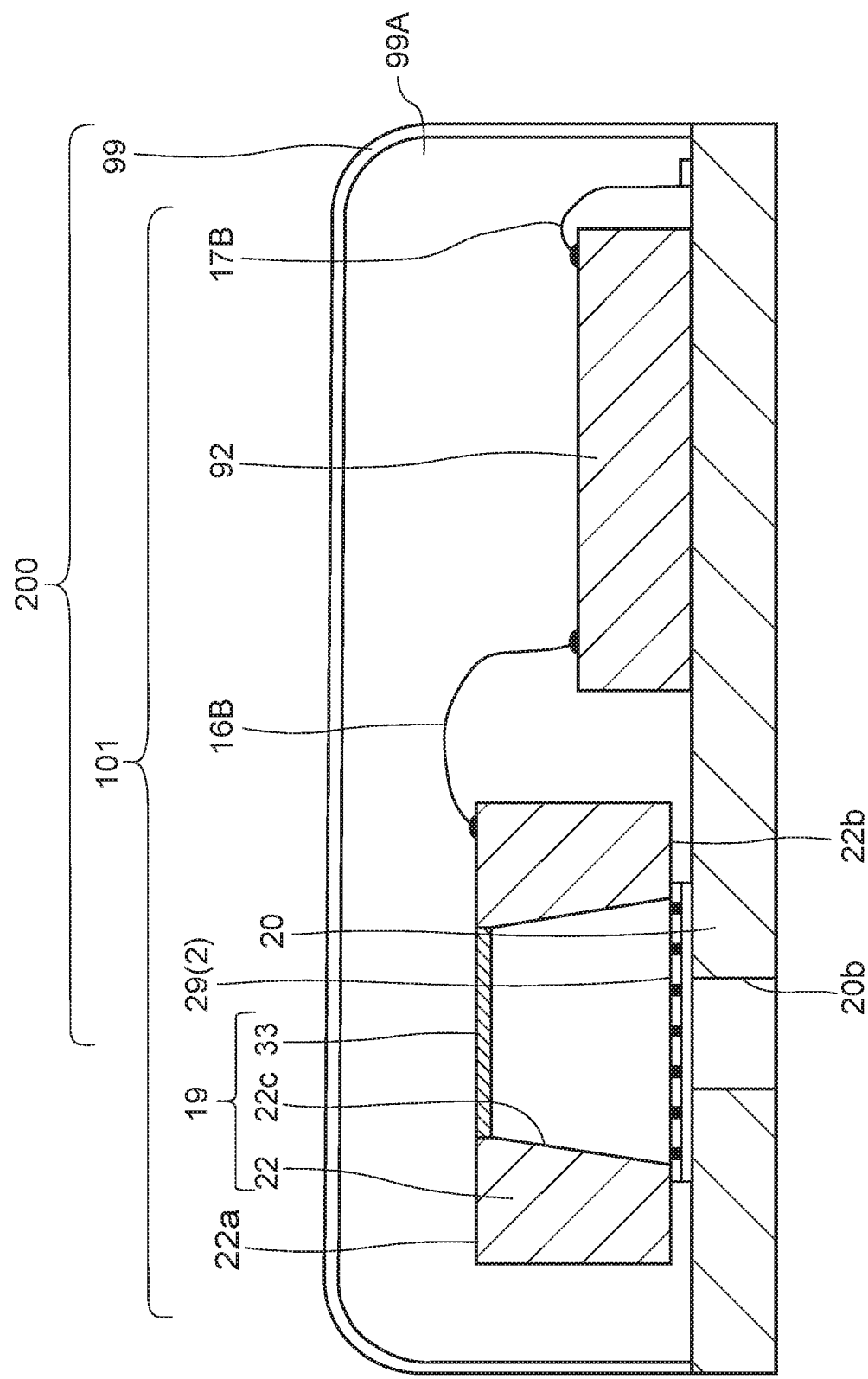
FIG. 23 is a sectional view, corresponding to FIG. 20, of the MEMS microphone according to the modified example.

Next, the MEMS microphone 200, according to a modified example, is explained with reference to FIG. 23. FIG. 23 is a sectional view of the MEMS microphone 200, corresponding to FIG. 20.

As illustrated in FIG. 23, the MEMS microphone 200 has the MEMS package 101 and the cap 99.

In case of the above-described MEMS microphone 100 (the MEMS package 31), the MEMS chip 19 and the ASIC 92 are mounted on the package substrate 20 by the flip chip bonding.

To the contrary, in case of the MEMS microphone 200 according to the modified example, the MEMS chip 19 and the ASIC 92 are mounted on the package substrate 20 by the wire bonding.

Then, the MEMS package 101 is different in the following a), b), c), as compared with the MEMS package 31.

a) The thin-film filter 29 is formed on the MEMS chip 10.
b) The MEMS package 101 does not have the bonding bumps 44, the sound shield 6, the electrode pads 7, 21.
c) The MEMS chip 19 is connected to the ASIC 92 by the wire 16B.

In case of the MEMS package 31, the thin-film filter 29 is formed on the package substrate 20 though, in case of the MEMS package 101, the thin-film filter 29 is formed on the MEMS chip 19.

The ASIC 92 is connected to the package substrate 20 by the wire 17B not by the bonding bumps 93.

Because the thin-film filter 29 is also formed on the MEMS microphone 200, the MEMS microphone 200 has the same operation and effect with the MEMS microphone 100.

In the above-described embodiment, the type "double back-plate" having two not illustrated thin-films which are called back-plate are arranged in the upper side and the lower side of the membrane 33, is explained exemplarily in the embodiment. The present invention is also applicable to the type "single back-plate", having one back-plate is arranged in the one side of the membrane 33. In this case, it is sufficient that the two bonding bumps 44 are formed. Further, as form of the through hole formed in the thin-film filter, circular-shape in a plan view, a hexagon shape, a rectangular shape are able to be used. When the substrate, made of the transparent material such glass, quartz or the like is used as the base substrate, the peeling adhesive layer is able to be used by attachment of UV tape to the base surface.

In the above-described embodiments, the MEMS microphone is explained as the example which the thin-film filter, according to the embodiment, is applied though, the thin-film filter is applied to products except for the MEMS microphone, for example MEMS sensor.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A thin-film filter comprising:
   a thin-film part having a film surface and a rear film surface arranged a rear side of the film surface,
   a plurality of through holes being formed to penetrate the thin-film part from the film surface to the rear film surface, and
   stripes-formed inner wall surfaces having stripe-like parts formed along with an intersecting direction intersecting the film surface, the stripes-formed inner wall surfaces are formed inside the respective through holes.

2. The thin-film filter according to claim 1,
wherein the stripe-like parts are arranged in almost the whole of the inner surface of the respective through holes.

3. The thin-film filter according to claim 1,
wherein the stripe-like parts are formed in the length longer than 80% of a film thickness being a thickness of the thin-film part.

4. The thin-film filter according to claim 1,
wherein the through holes are formed in a circular shape in a plan view,
wherein the thin-film filter comprises a first through hole-group and a second through hole-group respectively having the through holes,
wherein the first through hole-group has a first through hole, arranged in a position which the interval to a peripheral end part of the thin-film part is set a first interval, and the through holes are arranged at a constant interval in a straight line,
wherein the second through hole-group has a second through hole, arranged in a position which the interval to the peripheral end part is set a second interval different from the first interval, and the through holes are arranged at a constant interval in a straight line,
wherein in the thin-film filter, a first line formed by the first through hole-group, and a second line formed by the second through hole-group, are arranged alternately.

5. The thin-film filter according to claim 2,
wherein the through holes are formed in a circular shape in a plan view,
wherein the thin-film filter comprises a first through hole-group and a second through hole-group respectively having the through holes,
wherein the first through hole-group has a first through hole, arranged in a position which the interval to a peripheral end part of the thin-film part is set a first interval, and the through holes are arranged at a constant interval in a straight line,
wherein the second through hole-group has a second through hole, arranged in a position which the interval to the peripheral end part is set a second interval different from the first interval, and the through holes are arranged at a constant interval in a straight line,
wherein in the thin-film filter, a first line formed by the first through hole-group, and a second line formed by the second through hole-group, are arranged alternately.

6. The thin-film filter according to claim 4,
wherein in the thin-film filter, the adjacent through holes, including both the through hole included in the first through hole-group and the through hole included in the second through hole-group, are arranged to form a regular triangle which the centers of the adjacent through holes are vertexes.

7. A thin-film filter substrate comprising:
a base substrate having a base surface; and
a thin-film filter being formed on the base surface of the base substrate,
wherein the thin-film filter comprises a thin-film part having a film surface and a rear film surface arranged a rear side of the film surface, a plurality of through holes being formed to penetrate the thin-film part from the film surface to the rear film surface, and stripes-formed inner wall surfaces having stripe-like parts formed along with an intersecting direction intersecting the film surface, the stripes-formed inner wall surfaces are formed inside the respective through holes.

8. The thin-film filter substrate according to claim 7 further comprising:
a peeling-off adhesive layer capable of being peeled off,
wherein the peeling-off adhesive layer is formed on the base surface,
wherein the thin-film filter is formed on the peeling-off adhesive layer.

9. The thin-film filter substrate according to claim 7,
wherein the base substrate comprises a plurality of separative regions formed by a regular arrangement,
wherein the thin-film filter comprises a plurality of filter regions formed in accordance with the respective separative regions,
wherein the through holes and the stripes-formed inner wall surfaces are formed in the respective filter regions.

10. The thin-film filter substrate according to claim 8,
wherein the base substrate comprises a plurality of separative regions formed by a regular arrangement,
wherein the thin-film filter comprises a plurality of filter regions formed in accordance with the respective separative regions,
wherein the through holes and the stripes-formed inner wall surfaces are formed in the respective filter regions.

11. A method of manufacturing a thin-film filter comprising:
a peeling-off adhesive layer forming step of forming a peeling-off adhesive layer, capable of being peeled off, on a base substrate;
a thin-film filter forming step of forming a thin-film filter on the peeling-off adhesive layer; and
a thin-film filter peeling-off step of peeling off the thin-film filter from the peeling-off adhesive layer of a thin-film filter substrate, which the peeling-off adhesive layer and the thin-film filter are formed by performing the peeling-off adhesive layer forming step and the thin-film filter forming step,
wherein the thin-film filter forming step comprises a resin layer forming step of forming a resin layer on the peeling-off adhesive layer of the base substrate, and a through hole forming step of forming through holes which penetrate from a surface to the rear surface of the resin layer, so that stripes-formed inner wall surfaces, having stripe-like parts formed along with an intersecting direction intersecting the surface of the resin layer, are formed.

12. The method of manufacturing a thin-film filter according to claim 11,
wherein the thin-film filter forming step further comprises a metal layer forming step of forming a metal layer on the surface of the resin layer,
a resist pattern forming step of forming a resist pattern, which a plurality of hole parts are formed, on the metal layer, and
a metal pattern forming step of forming a metal pattern by forming corresponding hole parts, to the metal layer, corresponding to the hole parts using the resist pattern as a mask,
wherein the through hole forming step is performed by performing reactive ion etching using the metal pattern as a mask to form the stripes-formed inner wall surfaces.

13. A method of manufacturing a thin-film filter substrate, which a thin-film filter is formed on a base substrate comprising:

a peeling-off adhesive layer forming step of forming a peeling-off adhesive layer, capable of being peeled off, on the base substrate; and a thin-film filter forming step of forming a thin-film filter on the peeling-off adhesive layer, wherein the thin-film filter forming step comprises a resin layer forming step of forming a resin layer on the peeling-off adhesive layer of the base substrate, and a through hole forming step of forming through holes which penetrate from a surface to the rear surface of the resin layer, so that stripes-formed inner wall surfaces, having stripe-like parts formed along with an intersecting direction intersecting the surface of the resin layer, are formed.

14. The method of manufacturing a thin-film filter substrate according to claim 13, wherein the thin-film filter forming step further comprises a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts using the resist pattern as a mask, wherein the through hole forming step is performed by performing reactive ion etching using the metal pattern as a mask to form the stripes-formed inner wall surfaces.

15. A MEMS microphone comprising:

a MEMS chip;

a package substrate which the MEMS chip is adhered; and a thin-film filter formed on the package substrate or the MEMS chip, wherein the thin-film filter comprises a thin-film part having a film surface and a rear film surface arranged a rear side of the film surface, a plurality of through holes being formed to penetrate the thin-film part from the film surface to the rear film surface, and stripes-formed inner wall surfaces having stripe-like parts formed along with an intersecting direction intersecting the film surface, the stripes-formed inner wall surfaces are formed inside the respective through holes.

16. A method of manufacturing a MEMS microphone using a MEMS chip and a package substrate which the MEMS chip is adhered comprising:

a photosensitive-adhesive layer forming step of forming a photosensitive-adhesive layer, made of photosensitive-adhesive, on a surface of a package-panel which a plurality of package-regions for manufacturing the package substrate are formed;

a thin-film filter peeling-off step of peeling-off a thin-film filter from a peeling-off adhesive layer of a thin-film filter substrate, which is manufactured by performing a peeling-off adhesive layer forming step of forming the peeling-off adhesive layer, capable of being peeled off, on a base substrate and a thin-film filter forming step of forming the thin-film filter on the peeling-off adhesive layer; and a thin-film filter transcribing step for transcribing the thin-film filter, peeled off by the thin-film filter peeling-off step, to the package-panel, wherein the thin-film filter forming step comprises a resin layer forming step of forming a resin layer on the peeling-off adhesive layer of the base substrate, and a through hole forming step of forming through holes which penetrate from a surface to the rear surface of the resin layer, so that stripes-formed inner wall surfaces, having stripe-like parts formed along with an intersecting direction intersecting the surface of the resin layer, are formed.

17. The method of manufacturing the MEMS microphone according to claim 16, wherein the thin-film filter forming step further comprises a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts using the resist pattern as a mask, wherein the through hole forming step is performed by performing reactive ion etching using the metal pattern as a mask to form the stripes-formed inner wall surfaces.

* * * * *